US012756183B2

(12) United States Patent
Sobue

(10) Patent No.: US 12,756,183 B2
(45) Date of Patent: Oct. 6, 2026

(54) SEMICONDUCTOR DEVICE

(71) Applicant: Socionext Inc., Kanagawa (JP)

(72) Inventor: Isaya Sobue, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 139 days.

(21) Appl. No.: 18/942,029

(22) Filed: Nov. 8, 2024

(65) Prior Publication Data

US 2025/0158392 A1 May 15, 2025

(30) Foreign Application Priority Data

Nov. 13, 2023 (JP) ................................ 2023-192898

(51) Int. Cl.
*H02H 9/04* (2006.01)
*H10D 89/60* (2025.01)
*H10W 90/00* (2026.01)

(52) U.S. Cl.
CPC ............ *H02H 9/046* (2013.01); *H10D 89/60* (2025.01); *H10W 90/00* (2026.01)

(58) Field of Classification Search
CPC ....... H02H 9/046; H10D 89/60; H10W 90/00; H10W 42/60
USPC ........................................................... 361/56
See application file for complete search history.

(56) References Cited

U.S. PATENT DOCUMENTS 8,040,645 B2 10/2011 Jalilizeinali et al.
9,245,852 B2 * 1/2016 Chen .................... H10D 89/921
9,412,708 B2 8/2016 Chi
11,398,469 B1 7/2022 Karp
2004/0141269 A1 * 7/2004 Kitagawa ............. H10D 89/601 361/56
2011/0205673 A1 * 8/2011 Okushima ............ H03K 19/003 361/56
2012/0033335 A1 * 2/2012 Wang .................... H10W 42/60 361/56

(Continued)

FOREIGN PATENT DOCUMENTS

JP 2013-065870 A 4/2013

*Primary Examiner* — Dharti H Patel
(74) *Attorney, Agent, or Firm* — Rimon P.C.

(57) ABSTRACT

A semiconductor device includes: a substrate; first, second, and third substrate power-supply interconnects in the substrate; first and second substrate clamp circuits in the substrate, between the first and second substrate power-supply interconnects, and between the first and third substrate power-supply interconnects, respectively; first and second semiconductor chips on the substrate; first and second chip power-supply interconnects in the first semiconductor chip, electrically-connected to the first substrate power-supply interconnect and to the second substrate power-supply interconnect, respectively; a first circuit in the first semiconductor chip, between the first and second chip power-supply interconnects; third and fourth chip power-supply interconnects in the second semiconductor chip, electrically-connected to the first substrate power-supply interconnect and to the third substrate power-supply interconnect, respectively; and a second circuit in the second semiconductor chip, between the third and fourth chip power-supply interconnects, and a signal from the first circuit is input to the second circuit.

10 Claims, 15 Drawing Sheets

(56) References Cited

U.S. PATENT DOCUMENTS

| | | | | |
|---|---|---|---|---|
| 2012/0182650 | A1* | 7/2012 | Chi | H10W 42/60 438/107 |
| 2013/0063843 | A1* | 3/2013 | Chen | H10D 89/921 361/56 |
| 2014/0126089 | A1* | 5/2014 | Chang | H02H 9/046 361/56 |
| 2016/0093606 | A1* | 3/2016 | Chen | H10D 89/921 361/57 |
| 2016/0126942 | A1* | 5/2016 | Narita | H03K 17/08104 361/56 |
| 2021/0193647 | A1* | 6/2021 | Ma | H10D 89/611 |
| 2021/0313375 | A1 | 10/2021 | Masuda et al. | |

* cited by examiner

SEMICONDUCTOR DEVICE

CROSS-REFERENCE TO RELATED APPLICATION

This application claims priority based on Japanese Patent Application No. 2023-192898, filed with the Japan Patent Office on Nov. 13, 2023, the entire contents of which are incorporated herein by reference.

BACKGROUND OF THE INVENTION

1. Field of the Invention

The present disclosure relates to a semiconductor device.

2. Description of the Related Art

There are techniques for mounting multiple semiconductor chips (dies) on a silicon interposer. For example, there is a technique for providing an I/O (Input/Output) circuit on a die for connecting the die to the outside or to another die. There is also a technique for avoiding damaging elements due to an electro-static discharge (ESD) current by disposing a protection circuit (clamp circuit) between a power supply interconnect and a ground interconnect.

SUMMARY OF THE INVENTION

According to one example of the present disclosure, a semiconductor device includes:

a substrate;

a first substrate power supply interconnect, a second substrate power supply interconnect, and a third substrate power supply interconnect provided in the substrate, a voltage to be supplied to the first substrate power supply interconnect being different from a voltage to be supplied to the second substrate power supply interconnect, and a voltage to be supplied to the first substrate power supply interconnect being different from the voltage to be supplied to the third substrate power supply interconnect;

a first substrate clamp circuit provided in the substrate and positioned between the first substrate power supply interconnect and the second substrate power supply interconnect;

a second substrate clamp circuit provided in the substrate and positioned between the first substrate power supply interconnect and the third substrate power supply interconnect;

a first semiconductor chip and a second semiconductor chip provided on the substrate;

a first chip power supply interconnect provided in the first semiconductor chip and electrically connected to the first substrate power supply interconnect;

a second chip power supply interconnect provided in the first semiconductor chip and electrically connected to the second substrate power supply interconnect;

a first circuit provided in the first semiconductor chip and positioned between the first chip power supply interconnect and the second chip power supply interconnect;

a third chip power supply interconnect provided in the second semiconductor chip and electrically connected to the first substrate power supply interconnect;

a fourth chip power supply interconnect provided in the second semiconductor chip and electrically connected to the third substrate power supply interconnect; and a second circuit provided in the second semiconductor chip and positioned between the third chip power supply interconnect and the fourth chip power supply interconnect, and a signal output from the first circuit is input to the second circuit.

DETAILED DESCRIPTION OF THE PREFERRED EMBODIMENTS

When multiple semiconductor chips to which different power supply voltages are supplied are mounted on a silicon interposer, wiring provided on the silicon interposer and the semiconductor chips may become a discharge path for the ESD current. For example, when the input/output circuits of multiple semiconductor chips are connected by signal interconnects, the power supply voltage may change due to the ESD current flowing in the power supply interconnects of the semiconductor chips. In this case, there is a risk that an overvoltage may be applied to elements such as transistors provided in the input/output circuits. Providing a protection circuit for every semiconductor chip to protect elements such as each semiconductor chip's transistors from the ESD current might necessitate the chips to occupy a greater area.

The present disclosure has been made in view of the foregoing, and aims to protect multiple semiconductor chips mounted on a silicon interposer from ESD current while preventing or substantially preventing an increase in the area of chips.

According to the technique disclosed herein, multiple semiconductor chips mounted on a silicon interposer can be protected from ESD current while preventing or substantially preventing an increase in the area of chips.

Hereinafter, embodiments of the present disclosure will be described with reference to the accompanying drawings. In the following description, codes and symbols indicating signals are also used as codes and symbols indicating signal interconnects and signal terminals. Likewise, the code or symbol indicating a power supply voltage is also used to indicate the power supply interconnect and the power supply terminal to which the power supply voltage is supplied.

Figure 1:
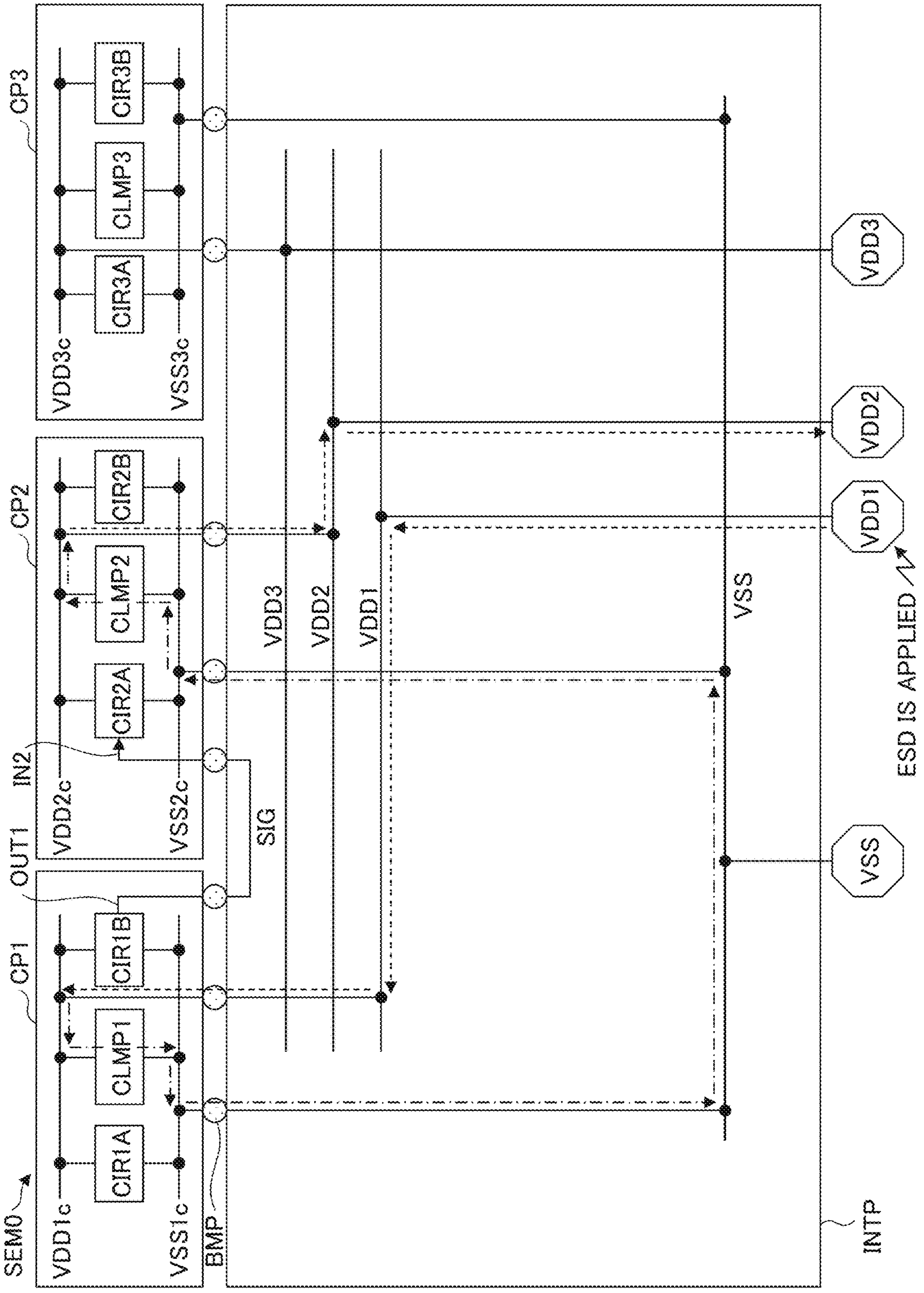
FIG. 1 is a block diagram that illustrates problems with a semiconductor device in which multiple semiconductor chips are mounted on a silicon interposer.

FIG. 1 is a block diagram that illustrates problems with a semiconductor device in which multiple semiconductor chips are mounted on a silicon interposer. The semiconductor device SEM0 shown in FIG. 1 has multiple semiconductor chips (chiplets) CP1, CP2, and CP3 mounted on a silicon interposer INTP, which is known as "2.5-D packaging." Note that, in FIG. 1, three semiconductor chips CP1, CP2, and CP3 are mounted on the silicon interposer INTP; however, for example, two or four or more semiconductor chips may be mounted on the silicon interposer INTP.

For example, the semiconductor chips CP1, CP2, and CP3 may each have a function to process signals or data, and cooperate with one another. By functions in the providing the implemented semiconductor device SEM0 by using multiple chiplets, each chiplet can be manufactured using an appropriate semiconductor manufacturing process. Therefore, compared to the case in which multiple chiplets are integrated into one chip, an increase in the manufacturing cost of the semiconductor device SEM0 can be prevented or substantially prevented.

The semiconductor chip CP1 includes internal circuits CIR1A and CIR1B, a clamp circuit CLMP1, a power supply interconnect VDD1*c*, and a ground interconnect VSS1*c*. The internal circuits CIR1A and CIR1B are positioned between the ground interconnect VSS1*c* and the power supply interconnect VDD1*c*, and operate by receiving a power supply voltage VDD1*c* and a ground voltage VSS1*c*. The clamp circuit CLMP1 is positioned between the ground interconnect VSS1*c* and the power supply interconnect VDD1*c*, and protects the internal circuits CIR1A and CIR1B, which are circuits to be protected, from ESD.

The semiconductor chip CP2 includes internal circuits CIR2A and CIR2B, a clamp circuit CLMP2, a power supply interconnect VDD2*c*, and a ground interconnect VSS2*c*. The internal circuits CIR2A and CIR2B are positioned between the ground interconnect VSS2*c* and the power supply interconnect VDD2*c*, and operate by receiving a power supply voltage VDD2*c* and a ground voltage VSS2*c*. The clamp circuit CLMP2 is positioned between the ground interconnect VSS2*c* and the power supply interconnect VDD2*c*, and protects the internal circuits CIR2A and CIR2B, which are circuits to be protected, from ESD.

The semiconductor chip CP3 includes internal circuits CIR3A and CIR3B, a clamp circuit CLMP3, a power supply interconnect VDD3*c*, and a ground interconnect VSS3*c*. The internal circuits CIR3A and CIR3B are positioned between the ground interconnect VSS3*c* and the power supply interconnect VDD3*c*, and operate by receiving a power supply voltage VDD3*c* and a ground voltage VSS3*c*. The clamp circuit CLMP3 is positioned between the ground interconnect VSS3*c* and the power supply interconnect VDD3*c*, and protects the internal circuits CIR3A and CIR3B, which are circuits to be protected, from ESD.

An output signal interconnect OUT1 connected to the internal circuit CIR1B of the semiconductor chip CP1 is electrically connected to a signal interconnect SIG formed in the silicon interposer ITNP through a bump BMP such as a microbump. The signal interconnect SIG is electrically connected to an input signal interconnect IN2, which is connected to the internal circuit CIR2A of the semiconductor chip CP2, through a bump BMP. That is, from the internal the output signal OUT1 output circuit CIR1B is input to the internal circuit CIR2A.

Hereinafter, the semiconductor chips CP1 to CP3 will also be referred to simply as "chips CP1 to CP3." In addition, when there is no need to distinguish between the semiconductor chips CP1 to CP3, they may also be referred to as "chip(s) CPx." When there is no need to distinguish between the internal circuits CIR1A and CIR1B, they may also be referred to as "internal circuit(s) CIR1*x*." When there is no need to distinguish between the internal circuits CIR2A and CIR2B, they may also be referred to as "internal circuit(s) CIR2*x*." When there is no need to distinguish between the internal circuits CIR3A and CIR3B, they may also be referred to as "internal circuit(s) CIR3*x*." When there is no need to distinguish between the internal circuits CIR1A, CIR1B, CIR2A, CIR2B, CIR3A, and CIR3B, they may also be referred to as "internal circuit(s) CIRx." When no distinction is made between the clamp circuits CLMP1 to CLMP3, they may also be referred to as "clamp circuit(s) CLMPx."

For example, the internal circuit CIRx is an input/output circuit. The clamp circuit CLMP1 prevents or substantially prevents the ESD current that flows into the chip CP1 from destroying the internal circuit CIR1*x* during the process of mounting the chip CP1 on the silicon interposer ITNP. The clamp circuit CLMP2 prevents or substantially prevents an ESD current flowing into the chip CP2 from destroying the internal circuit CIR2*x* during the process of mounting the chip CP2 on the silicon interposer ITNP. The clamp circuit CLMP3 prevents or substantially prevents an ESD current flowing into the chip CP3 from destroying the internal circuit CIR3*x* during the process of mounting the chip CP3 on the silicon interposer ITNP.

The silicon interposer ITNP has: a power supply interconnect VDD1 that is electrically connected to the power supply interconnect VDD1*c* of the chip CP1 via a bump BMP; a power supply interconnect VDD2 that is electrically connected to a power supply interconnect VDD2*c* of the chip CP2 via a bump BMP; and a power supply interconnect VDD3 that is electrically connected to a power supply interconnect VDD3*c* of the chip CP3 via a bump BMP. Note that the silicon interposer ITNP and each chip CPx may be electrically connected with each other through a TSV (Through Silicon Via). The silicon interposer ITNP also includes a ground interconnect VSS that is electrically connected with the ground interconnect VSS1*c* of the chip CP1, the ground interconnect VSS2*c* of the chip CP2, and the ground interconnect VSS3*c* of the chip CP3 via bumps BMP.

The silicon interposer ITNP has an external ground terminal and VSS external power supply terminals VDD1, VDD2, and VDD3, which are exposed on a surface of the silicon interposer ITNP. The external ground terminal VSS is electrically connected to the ground interconnect VSS of the silicon interposer ITNP. The external power supply terminal VDD1 is electrically connected to the power supply interconnect VDD1 of the silicon interposer ITNP. The external power supply terminal VDD2 is electrically connected to the power supply interconnect VDD2 of the silicon interposer ITNP. The external power supply terminal VDD3 is electrically connected to the power supply interconnect VDD3 of the silicon interposer ITNP.

The clamp circuit CLMP1 forms a current path between the power supply interconnect VDD1*c* and the ground interconnect VSS1*c* when ESD occurs, thereby protecting the internal circuit CIR1*x* from ESD. The clamp circuit CLMP2 forms a current path between the power supply interconnect VDD2*c* and the ground interconnect VSS2*c* when ESD occurs, thereby protecting the internal circuit CIR2*x* from ESD. The clamp circuit CLMP3 forms a current path between the power supply interconnect VDD3*c* and the ground interconnect VSS3*c* when ESD occurs, thereby protecting the internal circuit CIR3*x* from ESD.

ESD, which will be described below, occurs when a human finger or the like comes into contact with an external terminal of a semiconductor device SEM0 during transportation after manufacture of the semiconductor device SEM0 or when the semiconductor device SEM0 is mounted in a system. That is, the ESD model in the following description is a human body model (HBM).

In the semiconductor device SEM0, when each chip CPx is manufactured using advanced technology, the transistors often have a lower withstand voltage, thinner wiring, and higher wiring resistance than chips manufactured using legacy technology. High wiring resistance makes it difficult to discharge the ESD current sufficiently. It then follows that chips CPx manufactured using advanced technology may find it difficult to meet ESD protection specifications, for example, in automotive applications where the demand for reliability is stringent. When the clamp circuit CLMPx provided in each chip CPx is made larger in scale in order to strengthen the withstand voltage of transistors and the like against ESD, this leads to an increase in the chip size.

For example, assuming the human body model, when a positive ESD voltage is applied from the external power supply terminal VDD1 with respect to the external power supply terminal VDD2 (ESD application), an ESD current flows in the paths indicated by the dashed lines and dashed-and-dotted lines with arrow symbols shown in FIG. 1. The discharge path indicated by the dashed-and-dotted lines includes the clamp circuits CLMP1 and CLMP2, and therefore the potential difference between the current's input end and output end tends to be larger than in the discharge path indicated by the dashed lines.

For example, when ESD is applied, the rise of the power supply voltage VDD2 (VDD2*c*) may lag behind the rise of the power supply voltage VDD1 (VDD1*c*), possibly causing the high-level voltage of the output signal OUT1 from the internal circuit CIR1B to exceed the power supply voltage VDD2*c*. As a result of this, for example, if the potential difference between the gate and source (VDD2*c*) of the PMOS transistor of the internal circuit CIR2A that receives an input signal IN2 exceeds the withstand voltage of the transistor, the transistor may be destroyed.

First Embodiment

Figure 2:
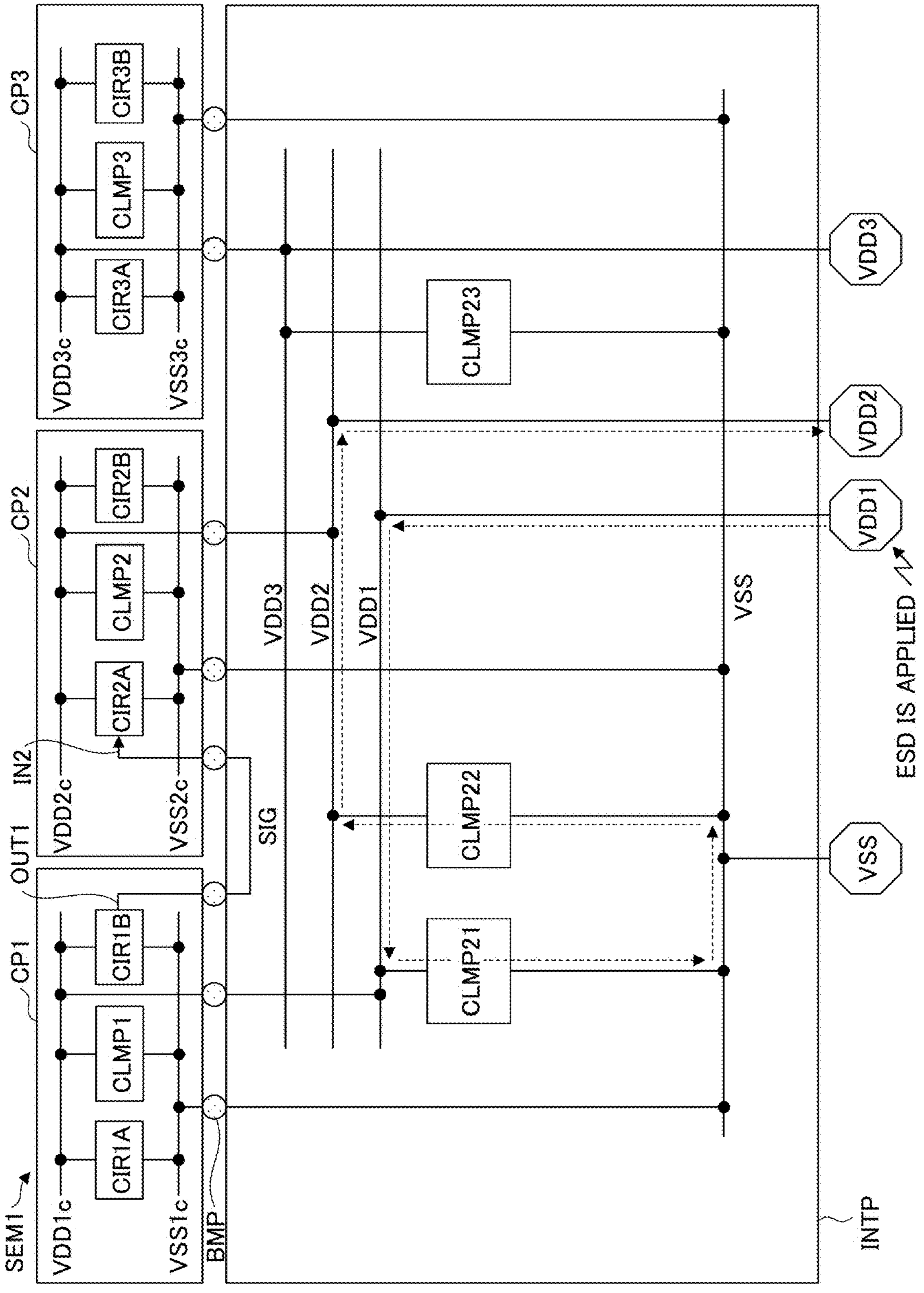
FIG. 2 is a block diagram that illustrates an example of a semiconductor device according to a first embodiment.

FIG. 2 shows an example of a semiconductor device according to the first embodiment. Elements that are the same as in FIG. 1 are assigned the same reference codes or numerals as in FIG. 1, and their detailed explanations will be omitted. The semiconductor device SEM1 shown in FIG. 2, like the semiconductor device SEM0 of FIG. 1, has multiple semiconductor chips (chiplets) CP1, CP2, and CP3 mounted on a silicon interposer INTP, which is known as "2.5-D packaging." The silicon interposer INTP is an example of a substrate. The chip CP1 is an example of a first semiconductor chip, and the chip CP2 is an example of a second semiconductor chip.

Assume that the circuit structures of the chips CP1, CP2, and CP3 are the same as in FIG. 1. Note that the power supply voltages VDD1, VDD2, and VDD3 may all have the same value, or may all have different values to an extent that conversion of the voltage levels of signals transmitted between the chips CPx is not necessary. Note that if measures are taken to prevent the ESD current from flowing into each chip CPx during the process of mounting each chip CPx on the silicon interposer ITNP, a clamp circuit CLMPx need not be formed in each chip CPx.

The silicon interposer INTP has clamp circuits CLMP21, CLMP22, and CLMP23 added to the structure of FIG. 1. The clamp circuit CLMP21 is positioned between the ground interconnect VSS and the power supply interconnect VDD1. The clamp circuit CLMP22 is positioned between the ground interconnect VSS and the power supply interconnect VDD2. The clamp circuit CLMP31 is positioned between the ground interconnect VSS and the power supply interconnect VDD3. In the following description, when the clamp circuits CLMP21, CLMP22, CLMP23, etc. provided in the silicon interposer INTP are described in a uniform or collective manner, they may be referred to simply as "clamp circuits CLMP2*x*."

The ground interconnect VSS is an example of a first substrate power supply interconnect. The power supply interconnect VDD1 and power supply interconnect VDD2 of the silicon interposer ITNP are examples of second substrate power supply a interconnect and a third substrate power supply interconnect, respectively. The clamp circuit CLMP21 is an example of a first substrate clamp circuit. The clamp circuit CLMP22 is an example of a second substrate clamp circuit.

The ground interconnect VSS1*c* of the chip CP1 is an example of a first chip power supply interconnect, and the power supply interconnect VDD1*c* of the chip CP1 is an example of a second chip power supply interconnect. The ground interconnect VSS2*c* of the chip CP2 is an example of a third chip power supply interconnect, and the power supply interconnect VDD2*c* of the chip CP2 is an example of a fourth chip power supply interconnect.

The internal circuits CIR1A and CIR1B are each an example of a first circuit, which is a circuit to be protected from ESD. The internal circuits CIR2A and CIR2B are each an example of a second circuit, which is a circuit to be protected. The clamp circuit CLMP1 is an example of a first chip clamp circuit, and the clamp circuit CLMP2 is an example of a second chip clamp circuit. The scale of the clamp circuit CLMPx of each chip CPx is smaller than the scale of the clamp circuit CLMP2*x* of the interposer ITNP. The scale of the clamp circuit CLMPX will be later described with reference to FIG. 5.

In the semiconductor device SEM1, for example, assuming the human body model, when a positive ESD voltage is applied from the external power supply terminal VDD1 with respect to the external power supply terminal VDD2 (ESD application), an ESD current flows in the path indicated by the dashed lines with arrow symbols in FIG. 2. The clamp circuits CLMP 21 to CLMP23 are formed between the power supply interconnects VDD1 to VDD3 and the ground interconnect VSS, so that it is possible to prevent or substantially prevent the ESD current from flowing in each chip CPx, thereby preventing or substantially preventing the elements in each chip CPx from being destroyed.

Figure 3:
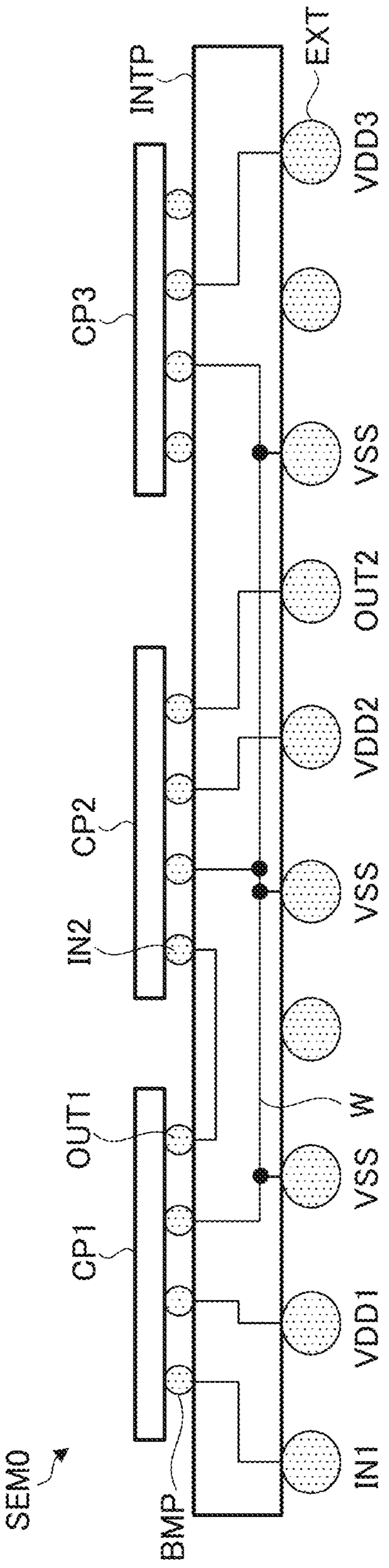
FIG. 3 is a cross-sectional view that illustrates an overview of connection between the silicon interposer and each chip of FIG. 2.

FIG. 3 is a cross-sectional view that illustrates an overview of connection between the silicon interposer INTP and each chip CPx in FIG. 2. The bumps BMP connected to each chip CPx are electrically connected to an external terminal EXT through the wiring in the silicon interposer ITNP, or are connected to another chip via bumps BMP and the wiring in the silicon interposer ITNP.

Figure 4:
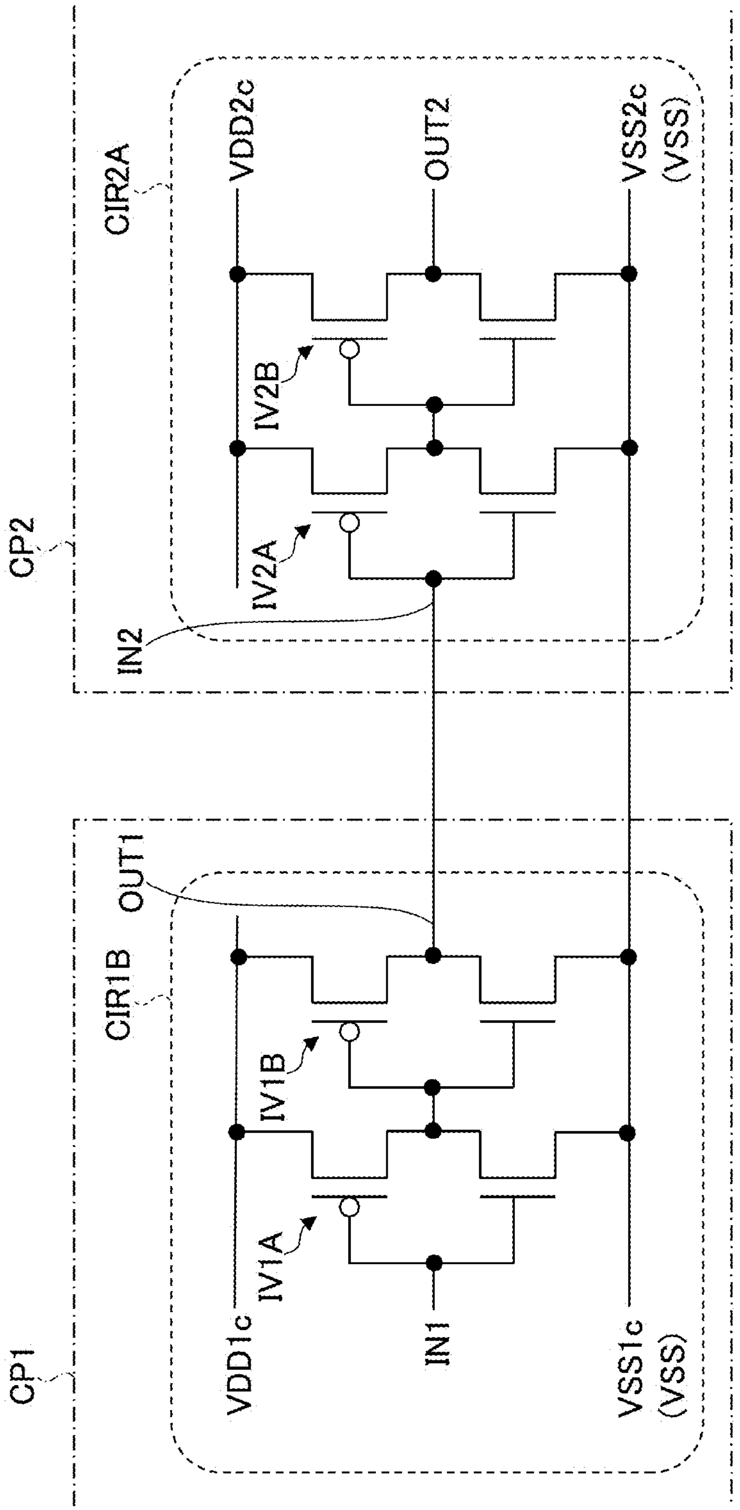
FIG. 4 is a circuit diagram that illustrates examples of internal circuits mounted on the semiconductor chips of FIG. 2.

FIG. 4 shows examples of the internal circuits CIR1B and CIR2A mounted on the semiconductor chips CP1 and CP2 in FIG. 2. For example, the internal circuit CIR1B has an output buffer including two inverters IV1 that are connected in series. The first inverter IV1A receives an input signal IN1, and the second inverter IV1B outputs an output signal OUT1.

For example, the internal circuit CIR2A has an input buffer including two inverters IV2 that are connected in series. The first inverter IV2A receives an input signal IN2, and the second inverter IV2B outputs an output signal OUT2. Note that the chip CP1 may be equipped with circuits other than an output buffer. The chip CP2 may be equipped with circuits other than an input buffer. Also, a signal may be transmitted from an output buffer formed in the chip CP2 to an input buffer formed in the chip CP1.

Figure 5:
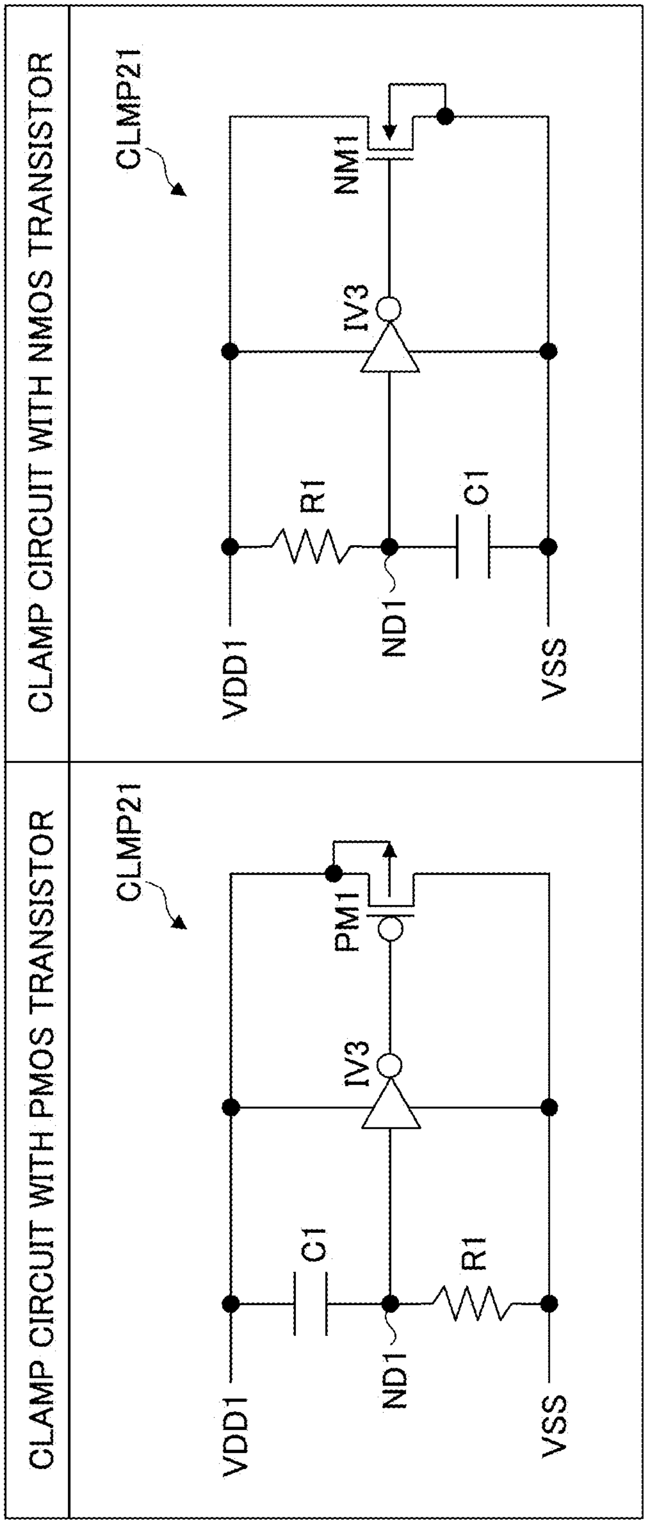
FIG. 5 is a circuit diagram that illustrates examples of the clamp circuits of FIG. 2.

FIG. 5 shows an example of the clamp circuit CLMP21 of FIG. 2. Note that the clamp circuits CLMP22 and CLMP23 may be the same as those shown in FIG. 5. The clamp circuit CLMP21 is formed using a PMOS transistor PM1 or an NMOS transistor NM1.

The clamp circuit CLMP21, in which the PMOS transistor PM1 is used, includes a capacitor C1, a resistor R1, an inverter IV3, and the PMOS transistor PM1. The capacitor C1 and the resistor R1 are connected in series between a power supply interconnect VDD1 and a ground interconnect VSS via a node ND1, and function as an RC time constant circuit. The inverter IV3 has its input connected to the node ND1 and its output connected to the gate of the PMOS transistor PM1. The PMOS transistor PM1 has its source and substrate connected to the power supply interconnect VDD1 and its drain connected to the ground interconnect VSS.

In the clamp circuit CLMP21 in which a PMOS transistor is used, when the system of the semiconductor device SEM1 operates, the input of the inverter IV3 is pulled down to a low level via the resistor R1, and the inverter IV3 outputs a high level. In the PMOS transistor PM1, the gate receives the high level and is turned off. When an ESD event occurs and an ESD voltage is applied to the power supply interconnect VDD1, the input of the inverter IV3 is brought up to a high level by the coupling of the capacitor C1, and the inverter IV3 outputs a low level. The PMOS transistor PM1 turns on when it receives the high level at its source and the low level at its gate, causing an ESD current to flow from the power supply interconnect VDD1 to the ground interconnect VSS.

The clamp circuit CLMP21, in which an NMOS transistor NM1 is used, includes a resistor R1, a capacitor C1, an inverter IV3, and the NMOS transistor NM1. The resistor R1 and the capacitor C1 are connected in between a series power supply interconnect VDD1 and a ground interconnect VSS via a node ND1, and function as an RC time constant circuit. The inverter IV3 has its input connected to the node ND1 and its output connected to the gate of the NMOS transistor NM1. The NMOS transistor NM1 has its drain connected to the power supply interconnect VDD1 and its source and substrate connected to the ground interconnect VSS.

In the clamp circuit CLMP21, in which an NMOS transistor is used, when the system of the semiconductor device SEM1 operates, the input of inverter IV3 is pulled up to high level via the resistor R1, and the inverter IV3 outputs a low level. The NMOS transistor NM1 is turned off when the low level is received at the gate. When an ESD event occurs and an ESD voltage is applied to the power supply interconnect VDD1, the input of the inverter IV3 is regarded as being at a low level due to the RC time constant of the resistor R1 and the capacitor C1, and the inverter IV3 outputs a high level. The NMOS transistor NM1 receives the low level at its source and the high level at its gate, thereupon turning on and allowing an ESD current to flow from the power supply interconnect VDD1 to the ground interconnect VSS.

Note that the clamp circuit CLMPx formed of each chip CPx is the same as the clamp circuit CLMP2*x* of the silicon interposer ITNP, and includes an RC time constant circuit and a transistor that passes current when an ESD-induced overvoltage is produced. The transistor in the clamp circuit CLMPx of each chip CPx is smaller in size than the transistor in each clamp circuit CLMP2*x* of the silicon interposer ITNP. For example, the size of a transistor may be indicated by its gate width. Furthermore, the RC time constant of the RC time constant circuit in the clamp circuit CLMPx of each chip CPx may be smaller than the RC time constant of the RC time constant circuit in each clamp circuit CLMP2*x* of the silicon interposer ITNP.

Figure 6:
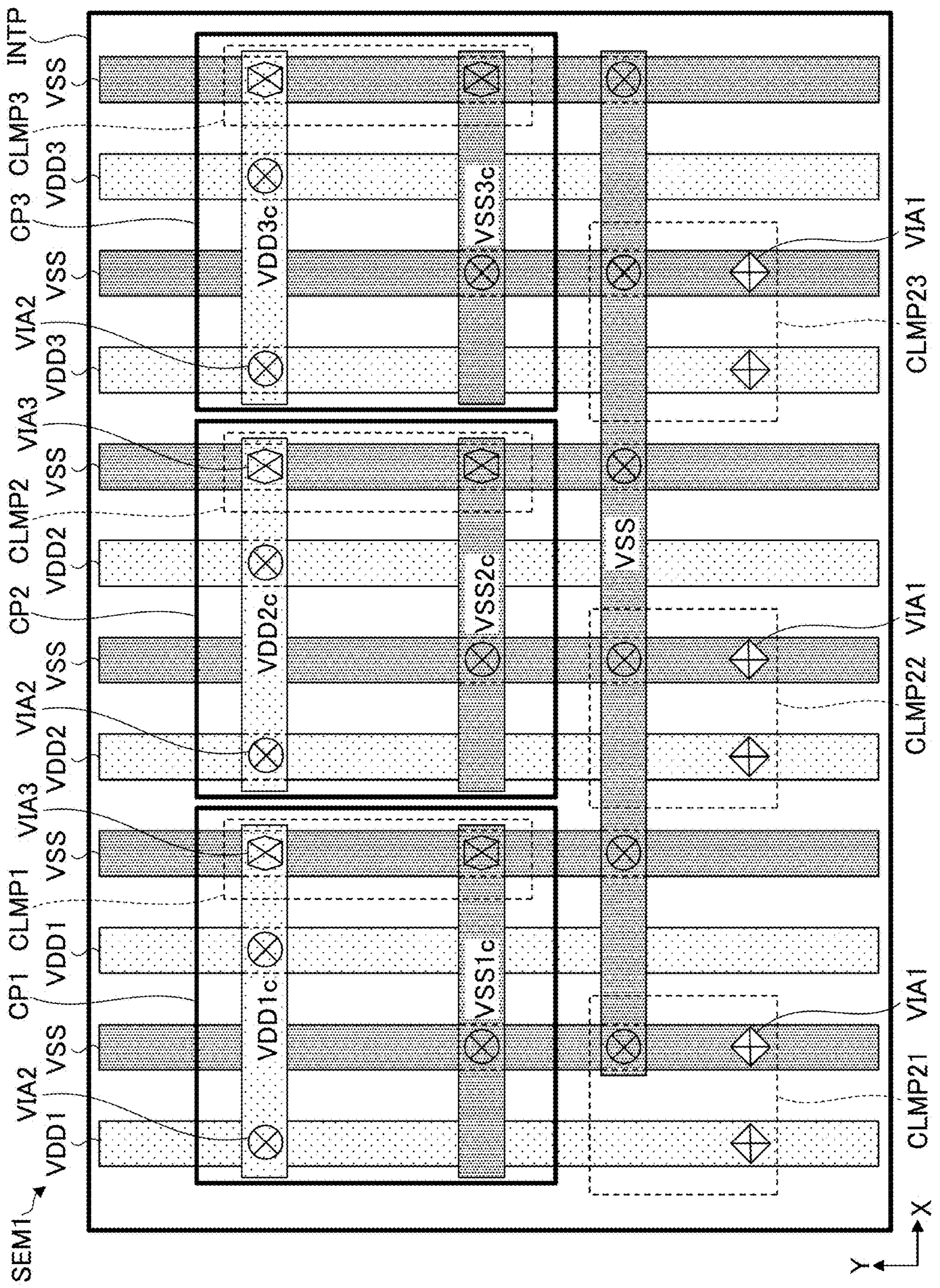
FIG. 6 is a transparent plan view that illustrates an example arrangement of wiring and circuits in the silicon interposer and each chip of illustrates an overall structure of the silicon cross-sectional view that interposer of FIG. 2.

FIG. 6 shows an example arrangement of wiring and circuits formed in the silicon interposer ITNP and each chip CPx in FIG. 2. The ground interconnect VSS and the power supply interconnects VDD1, VDD2, and VDD3 of the silicon interposer ITNP are arranged so as to extend in the Y direction, at intervals in the X direction. The power supply interconnects VDD1, VDD2, and VDD3, and ground interconnect VSS are positioned alternately. In addition, in the silicon interposer ITNP, a ground interconnect VSS for connecting together the ground interconnects VSS that extend in the Y direction is positioned to extend in the X direction.

The clamp circuit CLMP21 of the silicon interposer ITNP is positioned where a power supply interconnect VDD1 and a ground interconnect VSS of the silicon interposer ITNP are located, and is electrically connected to power supply the interconnect VDD1 and the ground interconnect VSS through vias VIA1. The positioning of the clamp circuit CLMP21 is not limited to that shown in FIG. 6, and the clamp circuit CLMP21 has only to be positioned at a location where it overlaps a power supply interconnect VDD1 and a ground interconnect VSS of the silicon interposer ITNP in plan view.

The clamp circuit CLMP22 is positioned where a power supply interconnect VDD2 and a ground interconnect VSS of the silicon interposer ITNP are located, and is electrically connected to the power supply interconnect VDD2 and the ground interconnect VSS through vias VIA1. The positioning of the clamp circuit CLMP22 is not limited to that shown in FIG. 6, and the clamp circuit CLMP22 has only to be positioned at a location where it overlaps a power supply interconnect VDD2 and a ground interconnect VSS of the silicon interposer ITNP in plan view.

The clamp circuit CLMP23 is positioned where a power supply interconnect VDD3 and a ground interconnect VSS of the silicon interposer ITNP are located, and is electrically connected to the power supply interconnect VDD3 and the ground interconnect VSS through vias VIA1. The positioning of the clamp circuit CLMP23 is not limited to that shown in FIG. 6, and the clamp circuit CLMP23 has only to be positioned at a location where it overlaps a power supply interconnect VDD3 and a ground interconnect VSS of the silicon interposer ITNP in plan view.

The chip CP1 is positioned where power supply interconnects VDD1 and ground interconnects VSS of the silicon interposer ITNP are located. The power supply interconnect VDD1*c* and the ground interconnect VSS1*c* of the chip CP1 are arranged so as to extend in the X direction, spaced apart in the Y direction, and are electrically connected to the power supply interconnects VDD1 and the ground interconnects VSS of the silicon interposer ITNP, respectively, through vias VIA2. The clamp circuit CLMP1 in the chip CP1 is electrically connected to the power supply interconnect VDD1*c* and a ground interconnect VSS of the chip CP1 through vias VIA3. The positioning of the clamp circuit CLMP1 is not limited to that shown in FIG. 6, and the clamp circuit CLMP1 has only to be positioned at a location where it overlaps the power supply interconnect VDD1*c* and the ground interconnect VSS1*c* of the chip CP1 in plan view.

The chip CP2 is positioned where power supply interconnects VDD2 and ground interconnects VSS of the silicon interposer ITNP are located. The power supply interconnect VDD2*c* and the ground interconnect VSS of the chip CP2 are arranged so as to extend in the X direction, spaced apart in the Y direction, and are electrically connected to the power supply interconnects VDD2 and the ground interconnects VSS of the silicon interposer ITNP, respectively, through vias VIA2. The clamp circuit CLMP2 in the chip CP2 is electrically connected to the power supply interconnect VDD2*c* and a ground interconnect VSS of the chip CP2 through vias VIA3. The positioning of the clamp circuit CLMP2 is not limited to that shown in FIG. 6, and the clamp circuit CLMP2 has only to be positioned at a location where it overlaps the power supply interconnect VDD2*c* and a ground interconnect VSS of the chip CP2 in plan view.

The chip CP3 is positioned where power supply interconnects VDD3 and ground interconnects VSS of the silicon interposer ITNP are located. The power supply interconnect VDD3*c* and the ground interconnect VSS of the chip CP3 are arranged so as to extend in the X direction, spaced apart in the Y direction, and are electrically connected to the power supply interconnects VDD3 and the ground interconnects VSS of the silicon interposer ITNP through vias VIA2, respectively. The clamp circuit CLMP3 of the chip CP3 is electrically connected to the power supply interconnect VDD3*c* and a ground interconnect VSS of the chip CP3 through vias VIA3. The positioning of the clamp circuit CLMP3 is not limited to that shown in FIG. 6, and the clamp circuit CLMP3 has only to be positioned at a location where it overlaps the power supply interconnect VDD3*c* and a ground interconnect VSS of the chip CP3 in plan view.

The vias VIA1 are provided to connect the wirings of the silicon interposer ITNP to each clamp circuit CLMP2*x*. The vias VIA2 are provided to connect the wirings of the silicon interposer ITNP and the wiring of each chip CPx together. The vias VIA3 are provided to connect the wiring of each chip CPx to each clamp circuit CLMPX.

The clamp circuit CLMPx in each chip CPx is smaller in scale than each clamp circuit CLMP2*x* of the interposer ITNP. Note that in each of the clamp circuits CLMPx and CLMP2*x*, the number of vias connected to the power supply interconnects and ground interconnects, and the number of connecting power supply interconnects and ground interconnects are not limited to the examples of FIG. 6.

Figure 7:
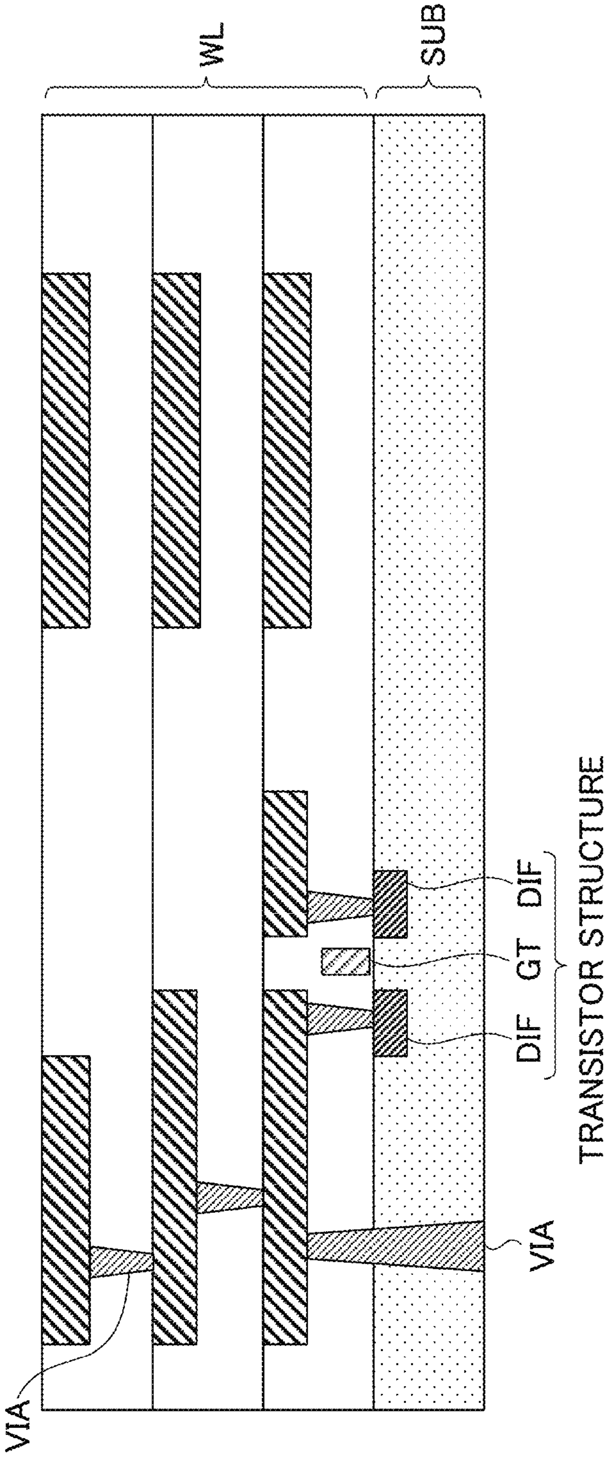

FIG. 7 shows an overall structure of the silicon interposer INTP of FIG. 2 in a cross-sectional view. The silicon interposer ITNP has a substrate SUB and multiple wiring layers WL formed in the substrate SUB. The substrate SUB has diffusion parts DIF, formed by injecting impurities. A transistor structure is formed by the diffusion parts DIF and a gate electrode GT formed over the diffusion parts DIF via a gate insulating film.

The capacitor C1 (FIG. 5) in each clamp circuit CLMP2*x* of the interposer ITNP of FIG. 2 may be formed by, for example, a capacitive element using a gate capacitance included in a transistor structure formed in a substrate SUB. The resistor R1 (FIG. 5) in each clamp circuit CLMP2*x* may be formed by, for example, a resistance element using a diffusion part DIF included in a transistor structure formed in a substrate SUB. Alternatively, the capacitor C1 or the resistor R1 in each clamp circuit CLMP2*x* may be formed by the capacitance (comb capacitance) or wiring resistance of wiring formed in the wiring layers WL. Additionally, the transistor structure may be used to form a diode or a thyristor.

As described above, according to the first embodiment, the clamp circuits CLMP21 to CLMP23 are formed between the power supply interconnects VDD1 to VDD3 and the ground interconnect VSS in the silicon interposer ITNP, so that it is possible to prevent or substantially prevent ESD current from flowing in the chips CP1 to CP3, and to prevent or substantially prevent the elements in the chips CP1 to CP3 from being destroyed.

The clamp circuits CLMP1 to CLMP3 formed in the chips CP1 to CP3, respectively, can prevent or substantially prevent the ESD current that flows into the chips CP1 to CP3 from destroying the internal circuits CIR1*x*, CIR2*x*, and CIR3*x* during the process of mounting the chips CP1 to CP3 on the silicon interposer ITNP.

By mounting the clamp circuits CLMP1 to CLMP3, which are smaller in scale than the clamp circuits CLMP21 to CLMP23, on the chips CP1 to CP3, respectively, it is possible to prevent or substantially prevent the chip size of the chips CP1 to CP3 from increasing.

Second Embodiment

Figure 8:
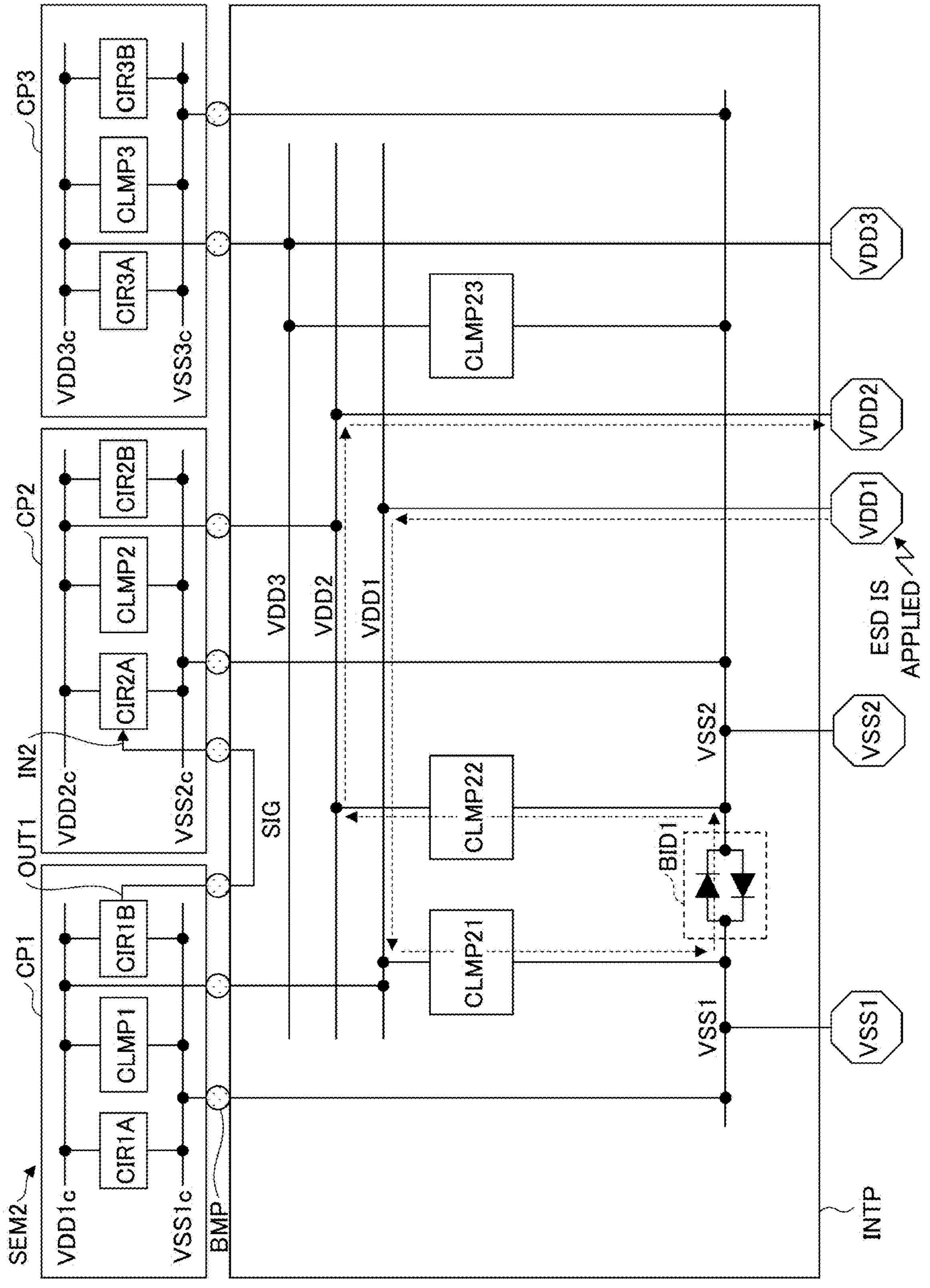
FIG. 8 is a block diagram that illustrates an example of a semiconductor device according to a second embodiment.

FIG. 8 shows an example of a semiconductor device according to a second embodiment. Elements that are the same as in FIG. 2 are assigned the same reference codes or numerals as in FIG. 2, and their detailed explanations will be omitted. The semiconductor device SEM2 shown in FIG. 8, like the semiconductor device SEM1 of FIG. 2, has multiple semiconductor chips (chiplets) CP1, CP2, and CP3 mounted on a silicon interposer INTP, which is known as "2.5-D packaging."

In the semiconductor device SEM2, the chip CP1 is electrically connected to the ground interconnect VSS1 of the silicon interposer ITNP, and the chips CP2 and CP3 are electrically connected to the ground interconnect VSS2 of the silicon interposer ITNP. Consequently, the semiconductor device SEM2 has external ground terminals VSS1 and VSS2. The silicon interposer ITNP includes: a ground interconnect VSS1 electrically connected to the external ground terminal VSS1; a ground interconnect VSS2 electrically connected to the external ground terminal VSS2; and a bi-directional diode BID1 positioned between the ground interconnects VSS1 and VSS2. The bi-directional diode BID1 may be formed using the transistor structure in the substrate SUB shown in FIG. 7.

The clamp circuit CLMP21 is positioned between the ground interconnect VSS1 and the power supply interconnect VDD1 of the silicon interposer ITNP. The clamp circuit CLMP22 is positioned between the ground interconnect VSS2 and the power supply interconnect VDD2 of the silicon interposer ITNP. The clamp circuit CLMP23 is positioned between the ground interconnect VSS2 and the power supply interconnect VDD3 of the silicon interposer ITNP.

The ground interconnect VSS1*c* of the chip CP1 connected is electrically to the ground interconnect VSS1 of the silicon interposer ITNP via a bump BMP. The ground interconnect VSS2*c* of the chip CP2 and the ground interconnect VSS3*c* of the chip CP3 are electrically connected to the ground interconnect VSS2 of the silicon interposer ITNP, respectively, via bumps BMP. Other elements of the semiconductor device SEM2 are the same as those of the semiconductor device SEM1 of FIG. 2.

The ground interconnects VSS1 and VSS2 of the silicon interposer ITNP are examples of a fourth substrate power supply interconnect and a fifth substrate power supply interconnect, respectively. The power supply interconnect VDD3 of the silicon interposer ITNP is an example of a sixth substrate power supply interconnect. The clamp circuit CLMP23 is an example of a third substrate clamp circuit. The bi-directional diode BID1 is an example of a first bi-directional diode. The ground interconnect VSS3*c* of the chip CP3 is an example of a fifth chip power supply interconnect. The power supply interconnect VDD3*c* of the chip CP3 is an example of a sixth chip power supply interconnect.

By forming the bi-directional diode BID1 in the silicon interposer ITNP, when a potential difference is produced between the ground interconnects VSS1 and VSS2, a current can flow in both of them. By this means, for example, when an ESD event occurs, the ESD current can flow between the ground interconnects VSS1 and VSS2, so that the ESD current can be discharged.

For example, assuming the human body model, when a positive ESD voltage is applied from the external power supply terminal VDD1 with respect to the external power supply terminal VDD2 (ESD application), an ESD current flows in the path, including the bi-directional diode BID1 and indicated by the dashed lines with arrow symbols shown in FIG. 8. This makes it possible to prevent or substantially prevent the ESD current from flowing in each chip CPx, and prevent or substantially prevent the elements in each chip CPx from being destroyed.

Note that, in the event the bi-directional diode BID1 is not formed in the silicon interposer ITNP, for example, a bi-directional diode may be formed in one of the chips CP1 to CP3, so as to prevent or substantially prevent the ESD current from flowing in each of the chips CP1 to CP3. For example, when a bi-directional diode is formed on the chip CP1, the ground interconnect VSS2 of the silicon interposer ITNP is electrically connected to the ground interconnect VSS1*c* of the chip CP1 via a bump BMP (or TSV).

This may cause the number of bumps BMPs (or TSVs) to exceed the limit. Furthermore, the chip size of the chip CP1 on which the bi-directional diode BID1 is formed increases, resulting in an increase in the chip's cost. The cost of chips also increases when the chip size increases, which leads to reduced yields. Furthermore, when each chip CPx is manufactured using advanced technology, there may be cases where there are no suitable bi-directional diodes that can be mounted on chips CPx.

Figure 9:
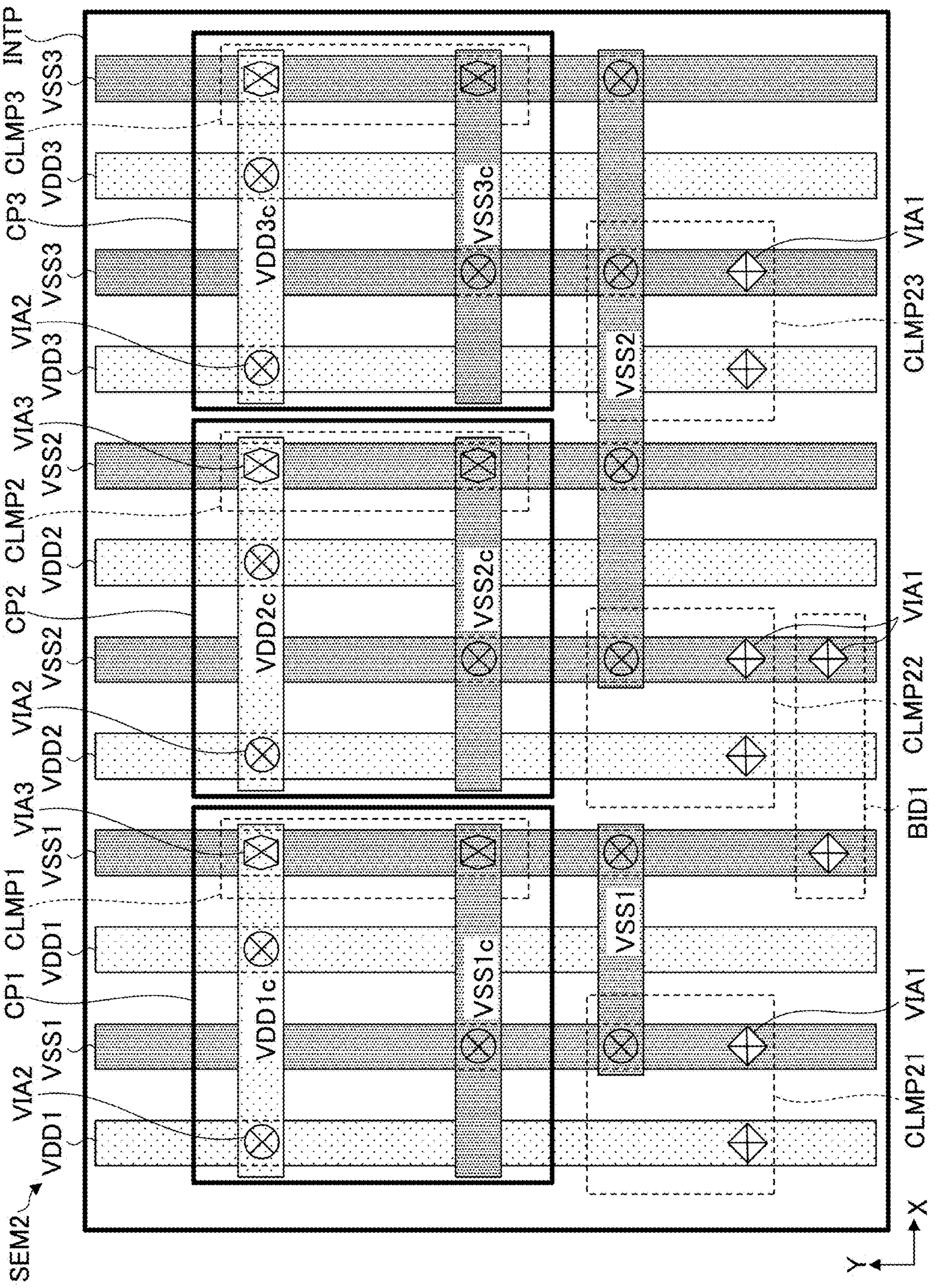
FIG. 9 is a transparent plan view that illustrates an example arrangement of wiring and circuits in the silicon interposer and each chip of FIG. 8.

FIG. 9 shows an example arrangement of wiring and circuits formed in the silicon interposer ITNP and each of the chips CP1 to CP3 in FIG. 8. Elements that are the same as in FIG. 6 are assigned the same reference codes or numerals as in FIG. 6, and their detailed explanations will be omitted.

FIG. 9 shows the same circuit arrangement as FIG. 6, except that a bi-directional diode BID1 is formed in the silicon interposer ITNP. The bi-directional diode BID1 is positioned in the part where the ground interconnects VSS1 and VSS2 are located, and is electrically connected to the ground interconnects VSS1 and VSS2 through vias VIA1. The ground interconnects VSS2 of the silicon interposer INTP are connected to the ground interconnect VSS2*c* of the chip CP2 and the ground interconnect VSS3*c* of the chip CP3. Note that the positioning of the bi-directional diode BID1 is not limited to that shown in FIG. 9, and the bi-directional diode BID1 has only to be positioned at a location where it overlaps ground interconnects VSS1 and VSS2 of the silicon interposer ITNP in plan view.

As described above, the second embodiment can also provide the same effects as the first embodiment. For example, in the silicon interposer ITNP, a clamp circuit CLMP21 is formed between a power supply interconnect VDD1 and a ground interconnect VSS1. Clamp circuits CLMP22 and CLMP23 are formed between a power supply interconnect VDD2 and a ground interconnect VSS2, and between a power supply interconnect VDD3 and a ground interconnect VSS2, respectively. This makes it possible to prevent or substantially prevent the ESD current from flowing in the chips CP1 to CP3, and to prevent or substantially prevent the elements in the chips CP1 to CP3 from being destroyed.

Furthermore, according to the second embodiment, when the chips CP1 to CP3 are connected to different ground interconnects VSS1 and VSS2, a bi-directional diode BID1 that electrically connects the ground interconnects VSS1 and VSS2 with each other is formed in the silicon interposer ITNP. By this means, for example, when an ESD event occurs, the ESD current can flow between the ground interconnects VSS1 and VSS2 of the silicon interposer INTP, so that the ESD current can be discharged. As a result of this, it is possible to prevent or substantially prevent the ESD current from flowing in the chips CP1 to CP3, thereby preventing or substantially preventing the elements in the chips CP1 to CP3 from being destroyed.

Third Embodiment

Figure 10:
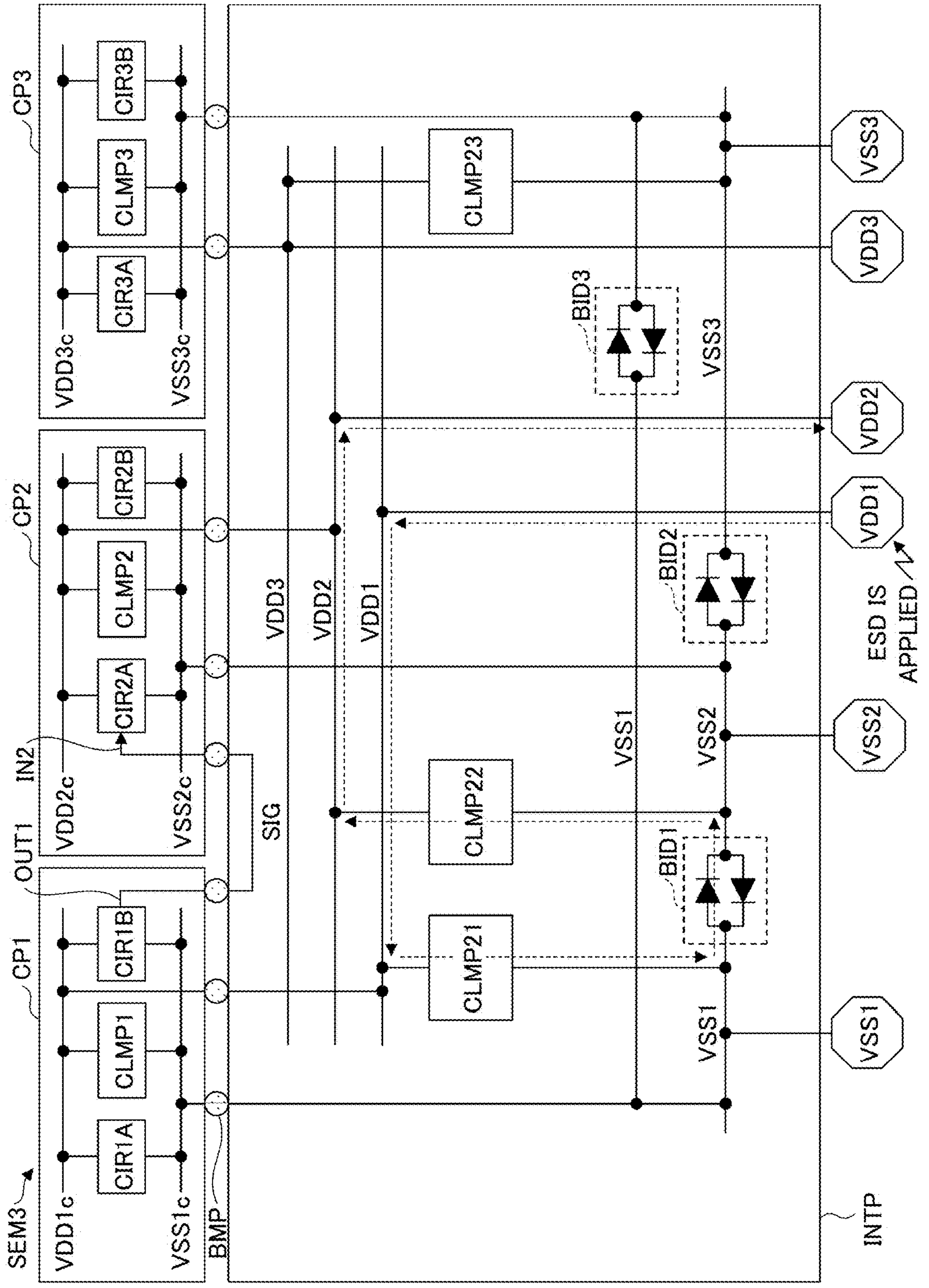
FIG. 10 is a block diagram that illustrates an example of a semiconductor device according to a third embodiment.

FIG. 10 shows an example of a semiconductor device according to a third embodiment. Elements that are the same as in FIG. 8 are assigned the same reference codes or numerals as in FIG. 8, and their detailed explanations will be omitted. The semiconductor device SEM3 shown in FIG. 10, like the semiconductor device SEM2 of FIG. 8, has multiple semiconductor chips (chiplets) CP1, CP2, and CP3 mounted on a silicon interposer INTP, which is known as "2.5-D packaging."

In the semiconductor device SEM3, the chip CP1 is electrically connected to the ground interconnect VSS1 of the silicon interposer ITNP, the chip CP2 is electrically connected to the ground interconnect VSS2 of the silicon interposer ITNP, and the chip CP3 is electrically connected to the ground interconnect VSS3 of the silicon interposer ITNP. Consequently, the semiconductor device SEM3 has external ground terminals VSS1, VSS2, and VSS3. The silicon interposer ITNP includes: a ground interconnect VSS1 electrically connected to the external ground terminal VSS1; a ground interconnect VSS2 electrically connected to the external ground terminal VSS2; and a ground interconnect VSS3 electrically connected to the external ground terminal VSS3.

Also, the silicon interposer ITNP includes: a bi-directional diode BID1 positioned between ground interconnects VSS1 and VSS2; a bi-directional diode BID2 positioned between ground interconnects VSS2 and VSS3; and a bi-directional diode BID3 positioned between ground interconnects VSS3 and VSS1. Each of the bi-directional diodes BID1 to BID3 may be formed using the transistor structure in the substrate SUB shown in FIG. 7. The clamp circuit CLMP23 is positioned between the power supply interconnect VDD3 and the ground interconnect VSS3 of the silicon interposer ITNP.

The ground interconnect VSS3*c* of the chip CP3 is electrically connected to the ground interconnect VSS3 of the silicon interposer ITNP via a bump BMP. The rest of the elements of the semiconductor device SEM3 are the same as those of the semiconductor device SEM2 of FIG. 8.

As in FIG. 8, for example, assuming the human body model, when a positive ESD voltage is applied from the external power supply terminal VDD1 with respect to the external power supply terminal VDD2 (ESD application), an ESD current flows in the path, including the bi-directional diode BID1 and indicated by the dashed lines with arrow symbols shown in FIG. 10. This makes it possible to prevent or substantially prevent the ESD current from flowing in each chip CP, and prevent or substantially prevent the elements in each chip CP from being destroyed.

Figure 11:
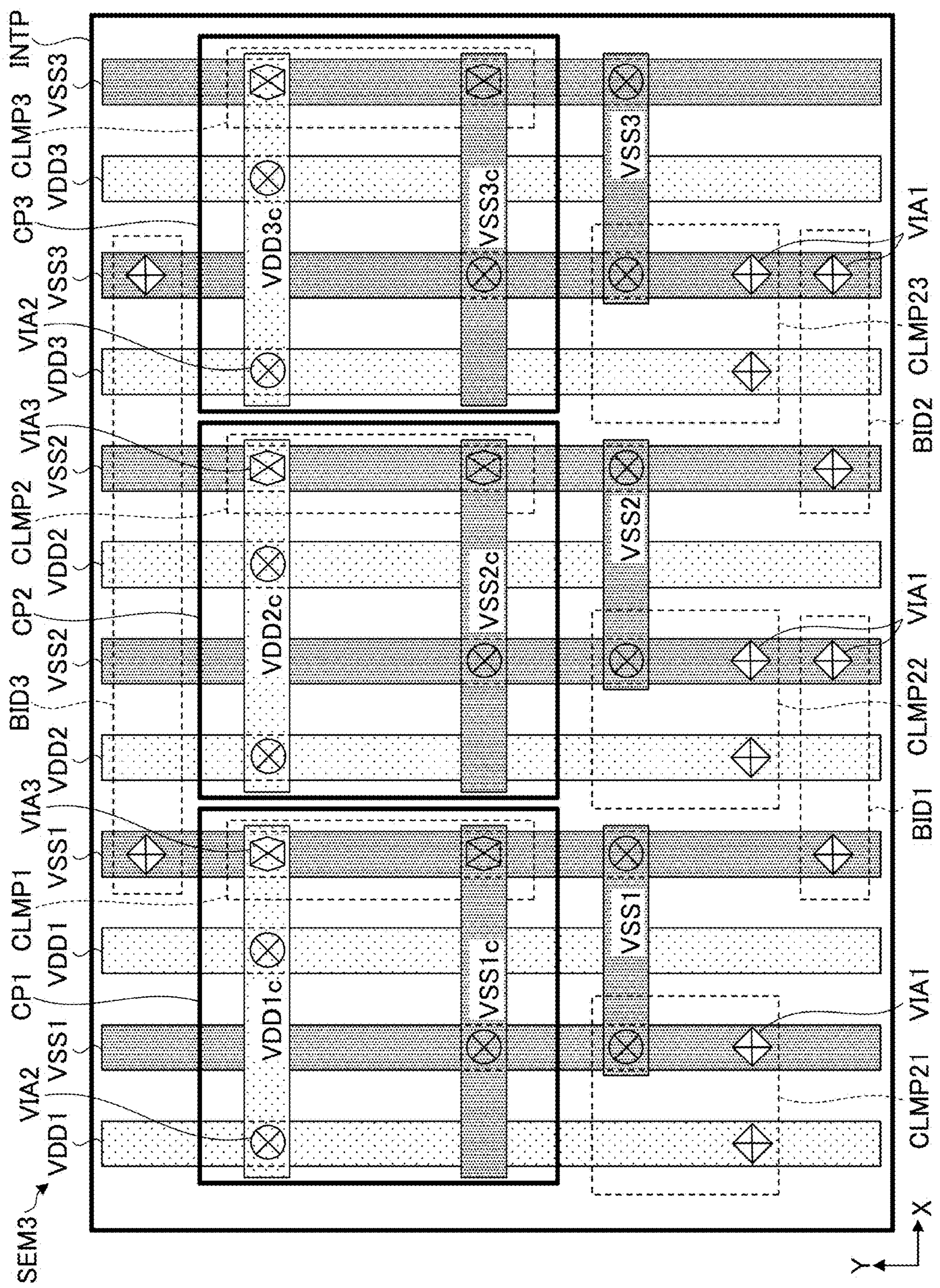
FIG. 11 is a transparent plan view that illustrates an example arrangement of wiring and circuits in the silicon interposer and each chip of FIG. 10.

FIG. 11 shows an example arrangement of wiring and circuits formed in the silicon interposer ITNP and each of the chips CP1 to CP3 in FIG. 10. Elements that are the same as in FIG. 6 and FIG. 9 are assigned the same reference codes or numerals as in FIG. 6 and FIG. 9, and their detailed explanations will be omitted. FIG. 11 shows the same circuit arrangement as FIG. 9, except that bi-directional diodes BID2 and BID3 are formed in the silicon interposer ITNP.

The bi-directional diode BID2 is positioned in the part where the ground interconnects VSS2 and VSS3 are located, and is electrically connected to the ground interconnects VSS2 and VSS3 through vias VIA1. The bi-directional diode BID3 is positioned in the part where the ground interconnects VSS3 and VSS1 are located, and is electrically connected to the ground interconnects VSS3 and VSS1 through vias VIA1. Note that the positioning of the bi-directional diode BID2 is not limited to that shown in FIG. 11, and the bi-directional diode BID2 has only to be positioned at a location where overlaps it the ground interconnects VSS2 and VSS3 of the silicon interposer ITNP in plan view. The positioning of the bi-directional diode BID3 is not limited to that shown in FIG. 11, and the bi-directional diode BID3 has only to be positioned at a location where it overlaps the ground interconnects VSS3 and VSS1 of the silicon interposer ITNP in plan view.

As described above, the third embodiment can also provide the same effects as the first and second embodiments. For example, in the silicon interposer ITNP, clamp circuits CLMP21 to CLMP23 are formed between power supply interconnects VDD1 to VDD3 and ground interconnects VSS1 to VSS3, respectively. This makes it possible to prevent or substantially prevent the ESD current from flowing in the chips CP1 to CP3, and to prevent or substantially prevent the elements in the chips CP1 to CP3 from being destroyed.

When the chips CP1 to CP3 are electrically connected to the ground interconnects VSS1 to VSS3 of the silicon interposer ITNP, respectively, bi-directional diodes BID1 to BID3 that electrically connect the ground interconnects VSS1 to VSS3 with each other are formed in the silicon interposer ITNP. By this means, for example, when an ESD event occurs, the ESD current can flow between the ground interconnects VSS1 to VSS3 of the silicon interposer INTP, so that the ESD current can be discharged. As a result of this, it is possible to prevent or substantially prevent the ESD current from flowing in the chips CP1 to CP3, thereby preventing or substantially preventing the elements in the chips CP1 to CP3 from being destroyed.

Fourth Embodiment

Figure 12:
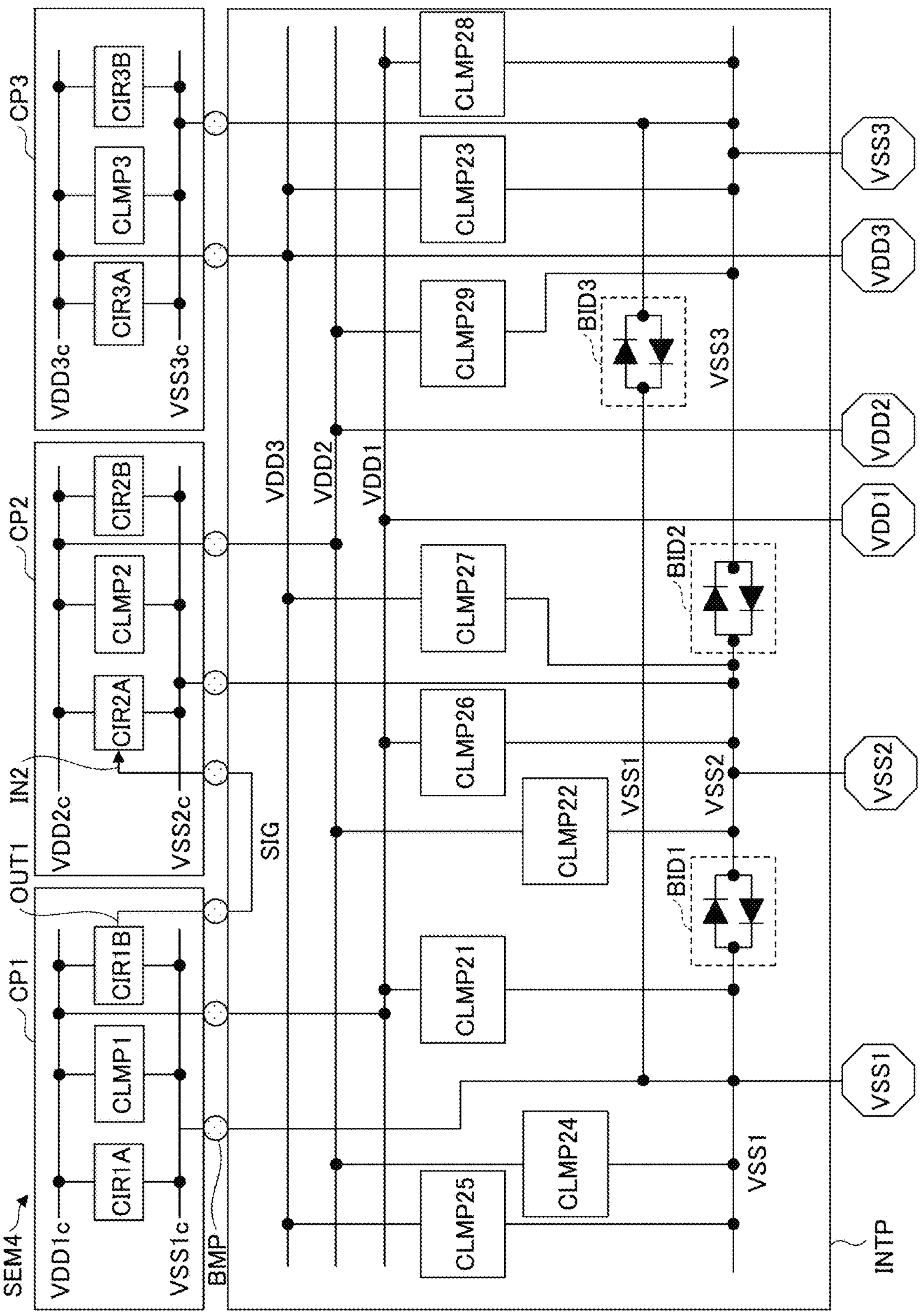
FIG. 12 is a block diagram that illustrates an example of a semiconductor device according to fourth embodiment.

FIG. 12 shows an example of a semiconductor device according to a fourth embodiment. Elements that are the same as in FIG. 10 are assigned the same reference codes or numerals as in FIG. 10, and their detailed explanations will be omitted. The semiconductor device SEM4 shown in FIG. 12, like the semiconductor device SEM3 of FIG. 10, has multiple semiconductor chips (chiplets) CP1, CP2, and CP3 mounted on a silicon interposer INTP, which is known as “2.5-D packaging.”

The interposer ITNP of the semiconductor device SEM4 includes clamp circuits CLMP24 and CLMP25, positioned between the ground interconnect VSS1 and the power supply interconnect VDD2 and between the ground interconnect VSS1 and the power supply interconnect VDD3, respectively. The interposer ITNP has clamp circuits CLMP26 and CLMP27, positioned between the ground interconnect VSS2 and the power supply interconnect VDD1 and between k the ground interconnect VSS2 and the power supply interconnect VDD3, respectively. The interposer ITNP has clamp circuits CLMP28 and CLMP29, positioned between the ground interconnect VSS3 and the power supply interconnects VDD1 and between the ground interconnect VSS3 and the power supply interconnect VDD2, respectively. That is, the interposer ITNP has crossed-domain clamp circuits CLMP2*x*. The rest of the elements of the semiconductor device SEM4 are the same as those of the semiconductor device SEM3 of FIG. 10.

The ground interconnect VSS1 of the silicon interposer INTP is an example of a fourth substrate power supply interconnect. The ground interconnect VSS2 of the silicon interposer INTP is an example of a seventh substrate power supply interconnect. The ground interconnect VSS3 of the silicon interposer INTP is an example of an eighth substrate power supply interconnect. The clamp circuit CLMP24 is an example of a fourth substrate clamp circuit. The clamp circuit CLMP25 is an example of a fifth substrate clamp circuit. The clamp circuit CLMP26 is an example of a sixth substrate clamp circuit. The clamp circuit CLMP27 is an example of a seventh substrate clamp circuit. The clamp circuit CLMP28 is an example of an eighth substrate clamp circuit. The clamp circuit CLMP29 is an example of a ninth substrate clamp circuit.

As described above, the fourth embodiment can also provide the same effects as the first to third embodiments. For example, it is possible to prevent or substantially prevent the ESD current from flowing in the chips CP1 to CP3, and to prevent or substantially prevent the elements in the chips CP1 to CP3 from being destroyed.

Fifth Embodiment

Figure 13:
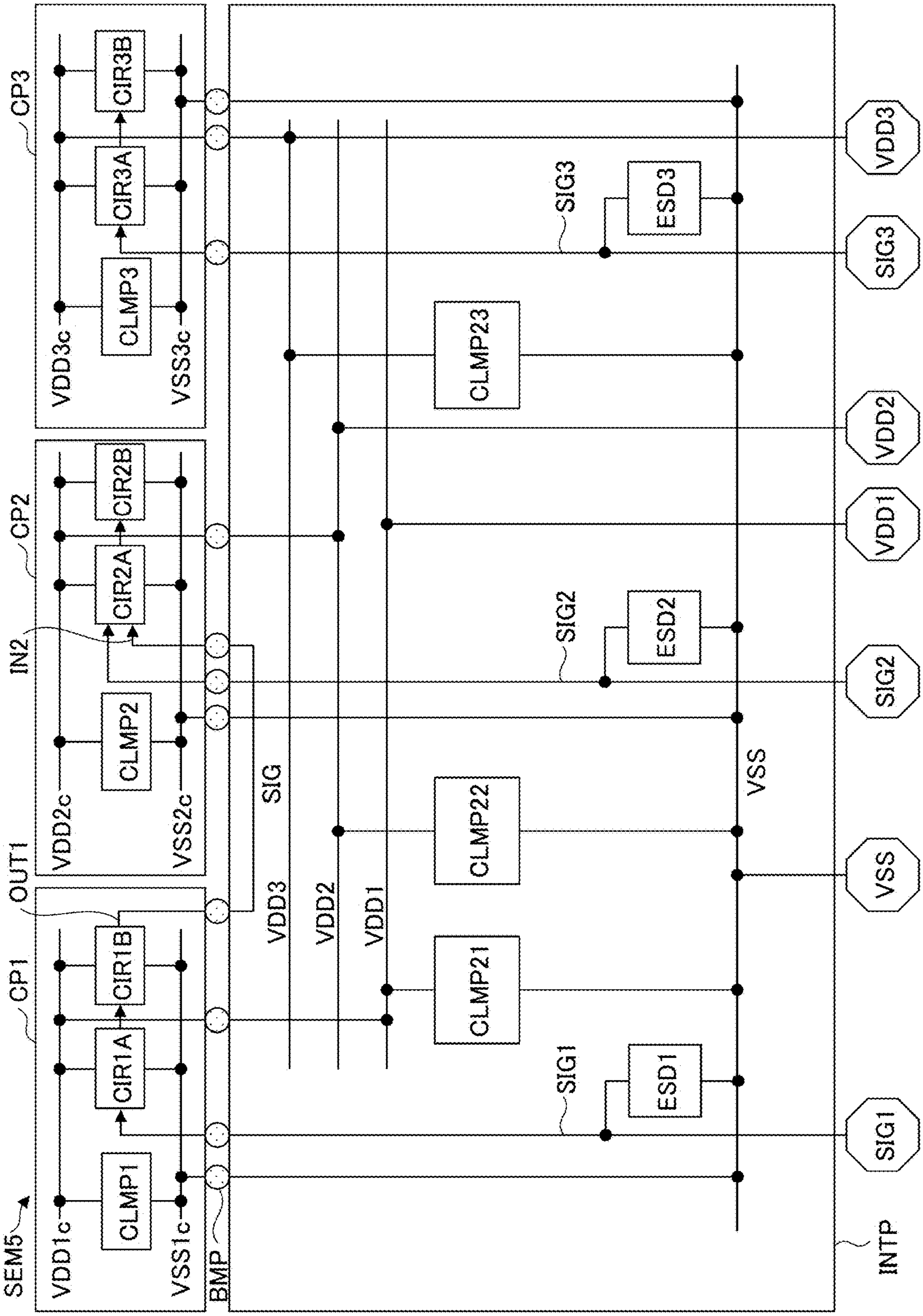
FIG. 13 is a block diagram that illustrates an example of a semiconductor device according to a fifth embodiment.

FIG. 13 shows an example of a semiconductor device according to a fifth embodiment. Elements that are the same as in FIG. 2 are assigned the same reference codes or numerals as in FIG. 2, and their detailed explanations will be omitted. The semiconductor device SEM5 shown in FIG. 13, like the semiconductor device SEM1 of FIG. 2, has multiple semiconductor chips (chiplets) CP1, CP2, and CP3 mounted on a silicon interposer INTP, which is known as "2.5-D packaging."

The interposer ITNP includes: a signal interconnect SIG1 electrically connected to an external signal terminal SIG1 and an input terminal of an internal circuit CIR1A of the chip CP1; and a protection circuit ESD1 against electrostatic discharge, positioned between the signal interconnect SIG1 and the ground interconnect VSS. The interposer ITNP includes: a signal interconnect SIG2 electrically connected to an external signal terminal SIG2 and an input terminal of an internal circuit CIR2A of the chip CP2; and a protection circuit ESD2 against electrostatic discharge, positioned between the signal interconnect SIG2 and the ground interconnect VSS. The interposer ITNP includes: a signal interconnect SIG3 electrically connected to an external signal terminal SIG3 and an input terminal of an internal circuit CIR3A of the chip CP3; and a protection circuit ESD3 against electrostatic discharge ESD3, positioned between the signal interconnect SIG3 and the ground interconnect VSS.

The external signal terminal SIG1 is an example of a first signal terminal. The external signal terminal SIG2 is an example of a second signal terminal. The signal interconnect SIG1 is an example of a first signal interconnect. The signal interconnect SIG2 is an example of a second signal interconnect. The internal circuit CIR1A is an example of a first circuit. The input terminal of the internal circuit CIR1A is an example of a first input terminal. The internal circuit CIR2A is an example of a second circuit. The input terminal of the internal circuit CIR2A is an example of a second input terminal. The protection circuit ESD1 is an example of a first protection circuit. The protection circuit ESD2 is an example of a second protection circuit.

The internal circuit CIR1A of the chip CP1 receives a signal SIG1 supplied to the external signal terminal SIG1, via the signal interconnect SIG1 of the silicon interposer ITNP, and outputs the signal to an internal circuit CIR1B. The internal circuit CIR2A of the chip CP2 receives a signal SIG2 supplied to the external signal terminal SIG2 via the signal interconnect SIG2 of the silicon interposer ITNP, receives an input signal IN2 from the chip CP1, and outputs these signals to an internal circuit CIR2B. The internal circuit CIR3A of the chip CP3 receives a signal SIG3 supplied to the external signal terminal SIG3 via the signal interconnect SIG3 of the silicon interposer ITNP, and outputs the signal to an internal circuit CIR3B.

A protection circuit ESD1 is positioned between the signal interconnect SIG1 and the ground interconnect VSS, and protects the internal circuit CIR1A from destruction by passing the ESD current to the ground interconnect VSS in the event an ESD event occurs and an ESD voltage is applied to the external signal terminal SIG1. The protection circuit ESD2 is positioned between the signal interconnect SIG2 and the ground interconnect VSS, and protects the internal circuit CIR2A from destruction by passing the ESD current to the ground interconnect VSS in the event an ESD event occurs and an ESD voltage is applied to the external signal terminal SIG2. The protection circuit ESD3 is positioned between the signal interconnect SIG3 and the ground interconnect VSS, and protects the internal circuit CIR3A from destruction by passing an ESD current to the ground interconnect VSS in the event an ESD event occurs and an ESD voltage is applied to the external signal terminal SIG3.

Figure 14:
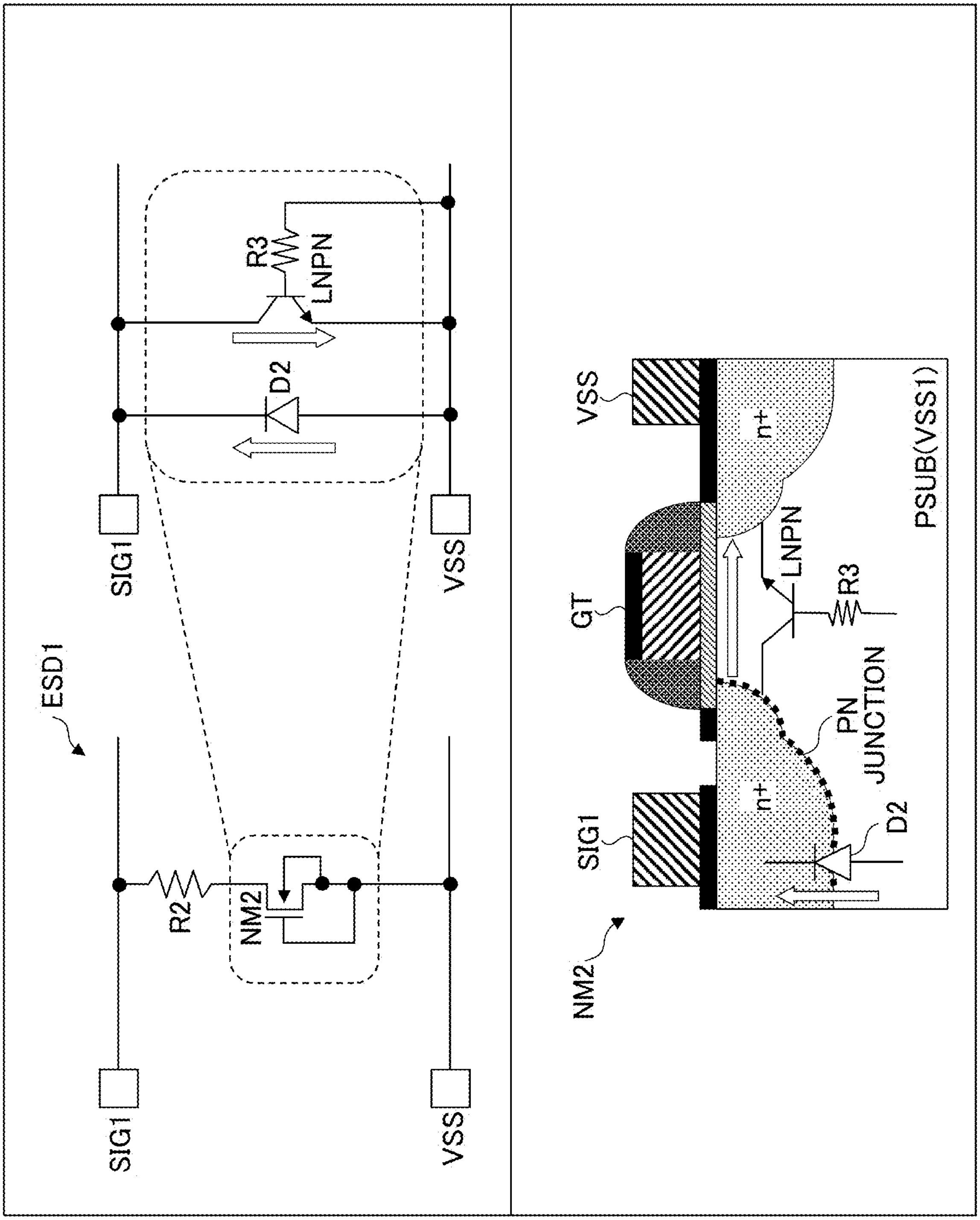
FIG. 14 is an explanatory diagram that illustrates an example of the ESD protection circuit of FIG. 13.

FIG. 14 shows an example of the ESD protection circuit ESD1 of FIG. 13. The ESD protection circuits ESD2 and ESD3 in FIG. 13 are the same as those in FIG. 14. The upper part of FIG. 14 shows the circuit structure of the ESD protection circuit ESD1. The lower part of FIG. 14 shows an example cross-sectional structure of an NMOS transistor NM2 included in the ESD protection circuit ESD1.

The ESD protection circuit ESD1 includes a resistor R2 and the NMOS transistor NM2 positioned in series between the signal interconnect SIG1 and the ground interconnect VSS. The gate, source, and substrate of the NMOS transistor NM2 are connected to the ground interconnect VSS. The drain of the NMOS transistor NM2 is electrically connected to the signal interconnect SIG1 via the resistor R2.

As a result of this, the NMOS transistor NM2 functions as a diode D2 whose anode is connected to the ground interconnect VSS and whose cathode is connected to the signal interconnect SIG1. This allows a negative ESD current to flow from the ground interconnect VSS to the signal interconnect SIG1 via the diode D2. In addition, the NMOS transistor NM2 functions as a parasitic lateral NPN bipolar transistor LNPN having a source, a substrate, and a drain. The parasitic lateral NPN bipolar transistor LNPN is electrically connected to the ground interconnect VSS via a resistor R3. This allows a positive ESD current to flow from the signal interconnect SIG1 to the ground interconnect VSS via the parasitic lateral NPN bipolar transistor LNPN.

Note that a fin field effect transistor (FinFET) may be arranged in place of the NMOS transistor NM2, which is a planar transistor. Also, a thyristor element may be used in place of the NMOS transistor NM2. Furthermore, the resistor R2 may be omitted in each of the ESD protection circuits ESD1, ESD2, and ESD3. Also, the NMOS transistor NM2 may be connected to a control circuit that controls the operation of the ESD protection circuit, instead of to the ground interconnect VSS.

Figure 15:
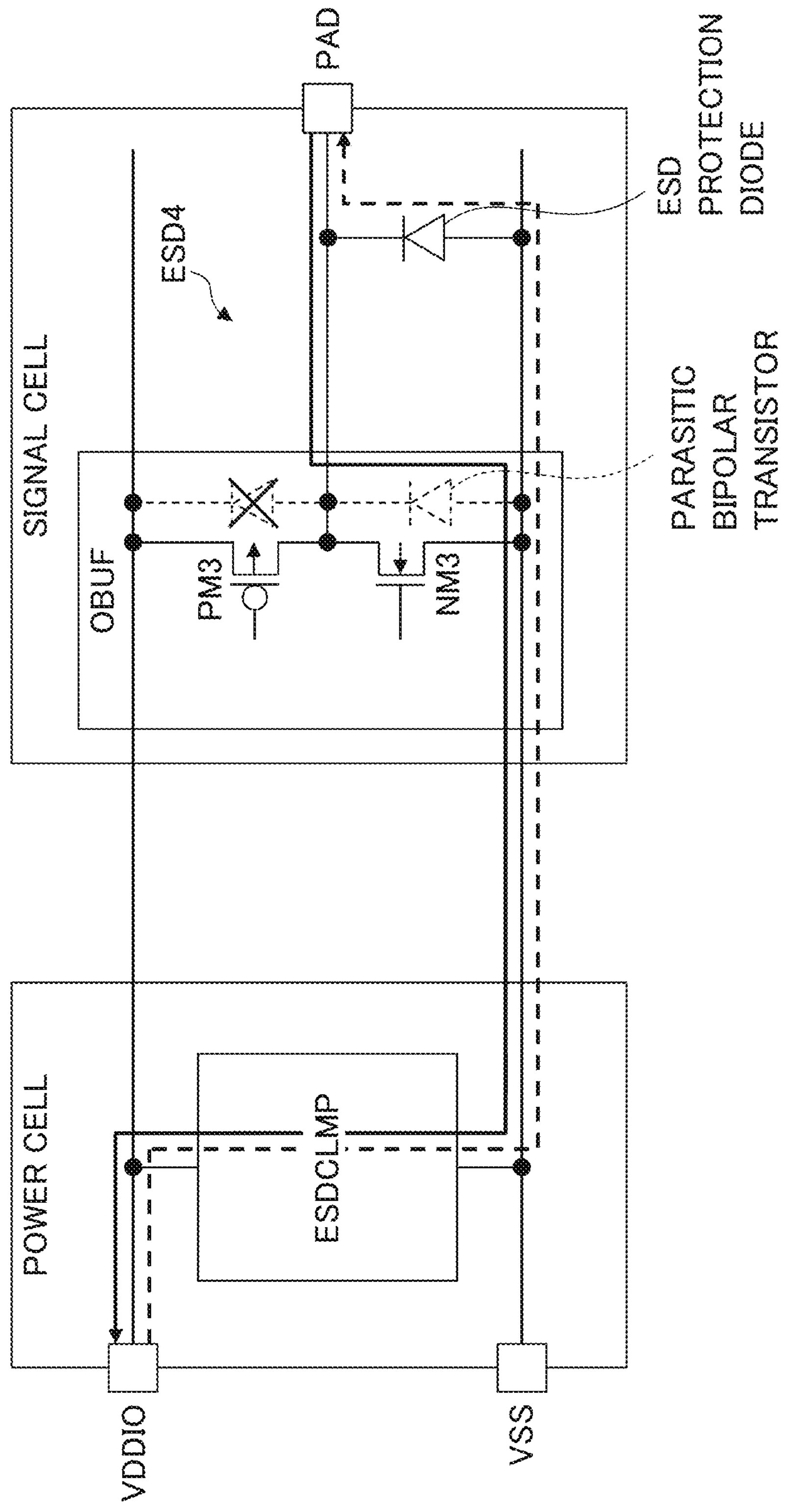
FIG. 15 is an explanatory diagram that illustrates another example of an ESD protection circuit.

FIG. 15 shows another example of an ESD protection circuit. The ESD protection circuit ESD4 shown in FIG. 15 is implemented as a fail-safe I/O buffer in a signal cell. The ESD protection circuit ESD4 is implemented by an ESD protection diode formed in the signal cell and a parasitic bipolar transistor (parasitic diode) formed in an NMOS transistor NM3 of the output buffer OBUF. The output buffer OBUF has a PMOS transistor PM3 and the NMOS transistor NM3 connected in series via a node of an external signal terminal PAD between the power supply interconnect VDDIO and the ground interconnect VSS for I/O.

The power supply cell has an ESD clamp circuit ESDCLMP positioned between an external power supply terminal VDDIO and an external ground terminal VSS. For example, when a positive ESD voltage is applied to the external signal terminal PAD V respect to the power supply terminal VDDIO, an ESD current flows from the external signal terminal PAD to the external power supply interconnect VDDIO via the parasitic bipolar transistor, the ground interconnect VSS, and the clamp circuit ESDCLMP, as shown by the thick solid line with an arrow symbol. In this way, the operation of a parasitic bipolar transistor is required for ESD protection when a positive ESD voltage is applied to a fail-safe I/O buffer.

When a negative ESD voltage is applied to the external signal terminal PAD with respect to the power supply terminal VDDIO, as indicated by the thick dashed line with an arrow symbol, an ESD current flows from the external power supply terminal VDDIO to the external signal terminal PAD through the clamp circuit ESDCLMP, the ground interconnect VSS, and the ESD protection diode.

Note that the discharge path when a positive or negative ESD voltage is applied to the signal pad with respect to the ground terminal VSS is similar to the discharge path shown in FIG. 15. For example, in the ESD countermeasure between the external signal terminal PAD and the external ground terminal VSS, a thyristor element may be added to the signal cell in addition to the output buffer OBUF.

As described above, the fifth embodiment can also provide the same effects as the first embodiment. For example, clamp circuits CLMP21 to CLMP23 of the silicon interposer ITNP can prevent or substantially prevent the ESD current from flowing to chips CP1 to CP3, and can prevent or substantially prevent destruction of elements in chips CP1 to CP3.

Furthermore, according to the fifth embodiment, ESD protection circuits ESD1 to ESD3 are arranged in the silicon interposer ITNP. As a result of this, even if an ESD voltage is applied to an external signal terminal through which signals are input to or output from the chips CP1 to CP3, it is possible to prevent or substantially prevent the ESD current from flowing in the chips CP1 to CP3. As a result of this, it is possible to prevent or substantially prevent the elements in the chips CP1 to CP3 from being destroyed.

Although the present disclosure has been described based on embodiments, the present disclosure is not limited to the specification or requirements shown in the above embodiments. These points may be changed without departing from the spirit of the present disclosure, and may be determined as appropriate depending on the application.

What is claimed is:

1. A semiconductor device comprising:

a substrate;

a first substrate power supply interconnect, a second substrate power supply interconnect, and a third substrate power supply interconnect provided in the substrate, a voltage to be supplied to the first substrate power supply interconnect being different from a voltage to be supplied to the second substrate power supply interconnect, and a voltage to be supplied to the first substrate power supply interconnect being different from the voltage to be supplied to the third substrate power supply interconnect;

a first substrate clamp circuit provided in the substrate and positioned between the first substrate power supply interconnect and the second substrate power supply interconnect;

a second substrate clamp circuit provided in the substrate and positioned between the first substrate power supply interconnect and the third substrate power supply interconnect;

a first semiconductor chip and a second semiconductor chip provided on the substrate;

a first chip power supply interconnect provided in the first semiconductor chip and electrically connected to the first substrate power supply interconnect;

a second chip power supply interconnect provided in the first semiconductor chip and electrically connected to the second substrate power supply interconnect;

a first circuit provided in the first semiconductor chip and positioned between the first chip power supply interconnect and the second chip power supply interconnect;

a third chip power supply interconnect provided in the second semiconductor chip and electrically connected to the first substrate power supply interconnect;

a fourth chip power supply interconnect provided in the second semiconductor chip and electrically connected to the third substrate power supply interconnect; and a second circuit provided in the second semiconductor chip and positioned between the third chip power supply interconnect and the fourth chip power supply interconnect, wherein a signal output from the first circuit is input to the second circuit.

2. The semiconductor device according to claim 1, further comprising:

a first chip clamp circuit provided in the first semiconductor chip and positioned between the first chip power supply interconnect and the second chip power supply interconnect; and a second chip clamp circuit provided in the second semiconductor chip and positioned between the third chip power supply interconnect and the fourth chip power supply interconnect.

3. The semiconductor device according to claim 2, wherein an element for passing a current when an overvoltage is produced is provided in all of the first substrate clamp circuit, the second substrate clamp circuit, the first chip clamp circuit, and the second chip clamp circuit, and wherein the element provided in the first chip clamp circuit and the second chip clamp circuit is smaller in size than the element provided in the first substrate clamp circuit and the second substrate clamp circuit.

4. The semiconductor device according to claim 3, wherein the first substrate clamp circuit, the second substrate clamp circuit, the first chip clamp circuit and the second chip clamp circuit each include an RC time constant circuit including a resistor and a capacitor, and wherein the RC time constant circuit of the first chip clamp circuit and the RC time constant circuit of the second chip clamp circuit have a smaller RC time constant than the RC time constant circuit of the first substrate clamp circuit and the RC time constant circuit of the second substrate clamp circuit.

5. The semiconductor device according to claim 1, further comprising a first bi-directional diode provided in the substrate, wherein the first substrate power supply interconnect includes a fourth substrate power supply interconnect and a fifth substrate power supply interconnect electrically connected via the first bi-directional diode, wherein the first chip power supply interconnect is electrically connected to the fourth substrate power supply interconnect, and wherein the third chip power supply interconnect is electrically connected to the fifth substrate power supply interconnect.

6. The semiconductor device according to claim 5, wherein the first substrate clamp circuit is positioned between the fourth substrate power supply interconnect and the second substrate power supply interconnect, and wherein the second substrate clamp circuit is positioned between the fifth substrate power supply interconnect and the third substrate power supply interconnect.

7. The semiconductor device according to claim 5, further comprising:

a sixth substrate power supply interconnect provided in the substrate, a voltage to be supplied to the sixth substrate power supply interconnect being different from the voltage to be supplied to the first substrate power supply interconnect;

a third semiconductor chip provided on the substrate;

a fifth chip power supply interconnect provided in the third semiconductor chip and electrically connected to fifth substrate power supply interconnect;

a sixth chip power supply interconnect provided in the third semiconductor chip and electrically connected to the sixth substrate power supply interconnect;

a third circuit provided in the third semiconductor chip and positioned between the fifth chip power supply interconnect and the sixth chip power supply interconnect; and a third substrate clamp circuit provided in the substrate and positioned between the fifth substrate power supply interconnect and the sixth substrate power supply interconnect.

8. The semiconductor device according to claim 7, further comprising a second bi-directional diode and a third bi-directional diode provided in the substrate, wherein the fifth substrate power supply interconnect includes a seventh substrate power supply interconnect and an eighth substrate power supply interconnect electrically connected via the second bi-directional diode, wherein the fourth substrate power supply interconnect is electrically connected to the eighth substrate power supply interconnect via the third bi-directional diode, wherein the third chip power supply interconnect is electrically connected to the seventh substrate power supply interconnect, and wherein the fifth chip power supply interconnect is electrically connected to the eighth substrate power supply interconnect.

9. The semiconductor device according to claim 8, further comprising at least one of:

a fourth substrate clamp circuit provided in the substrate and positioned between the fourth substrate power supply interconnect and the third substrate power supply interconnect;

a fifth substrate clamp circuit provided in the substrate and positioned between the fourth substrate power supply interconnect and the sixth substrate power supply interconnect;

a sixth substrate clamp circuit provided in the substrate and positioned between the seventh substrate power supply interconnect and the second substrate power supply interconnect;

a seventh substrate clamp circuit provided in the substrate and positioned between the seventh substrate power supply interconnect and the sixth substrate power supply interconnect;

an eighth substrate clamp circuit provided in the substrate and positioned between the eighth substrate power supply interconnect and the second substrate power supply interconnect; or a ninth substrate clamp circuit provided in the substrate and positioned between the eighth substrate power supply interconnect and the third substrate power supply interconnect.

10. The semiconductor device according to claim 1, further comprising:

a first signal terminal and a second signal terminal provided in the substrate;

a first signal interconnect provided in the substrate electrically connecting first signal terminal and a first input terminal of the first circuit;

a second signal interconnect provided in the substrate and electrically connecting the second signal terminal and a second input terminal of the second circuit;

a first protection circuit positioned between the first signal interconnect and the first substrate power supply interconnect; and a second protection circuit positioned between the second signal interconnect and the first substrate power supply interconnect.

* * * * *